(12) United States Patent
Yazaki et al.

(10) Patent No.: US 7,193,693 B2
(45) Date of Patent: Mar. 20, 2007

(54) APPARATUS FOR MANUFACTURING FLAT PANEL DISPLAY DEVICES

(75) Inventors: Akio Yazaki, Fuchu (JP); Mikio Hongo, Yokohama (JP); Mutsuko Hatano, Kokubunji (JP); Takeshi Noda, Mobara (JP)

(73) Assignee: Hitachi Displays, Ltd., Mobara (JP)

( * ) Notice: Subject to any disclaimer, the term of this patent is extended or adjusted under 35 U.S.C. 154(b) by 169 days.

(21) Appl. No.: 10/991,482

(22) Filed: Nov. 19, 2004

(65) Prior Publication Data

US 2005/0170569 A1    Aug. 4, 2005

(30) Foreign Application Priority Data

Jan. 30, 2004    (JP)    ............... 2004-022444

(51) Int. Cl.
 *G01N 21/00*    (2006.01)
 *G01J 1/00*    (2006.01)
 *B23K 26/06*    (2006.01)
(52) U.S. Cl. .................... 356/30; 356/121; 219/121.73
(58) Field of Classification Search ................. 356/30, 356/121, 138; 219/121.6, 121.65, 121.73
See application file for complete search history.

(56) References Cited

U.S. PATENT DOCUMENTS 6,632,711 B2    10/2003    Sugano et al.
6,693,258 B2    2/2004    Sugano et al.
2005/0169330 A1*    8/2005    Hongo et al. ............ 372/38.02

FOREIGN PATENT DOCUMENTS

| JP | 11-283933 | 10/1999 |
|---|---|---|
| JP | 2002-231958 | 8/2002 |
| JP | 2003-053578 | 2/2003 |
| JP | 2003-124136 | 4/2003 |
| JP | 2004-165598 | 6/2004 |

* cited by examiner

*Primary Examiner*—Hwa (Andrew) Lee
*Assistant Examiner*—Roy M. Punnoose
(74) *Attorney, Agent, or Firm*—Antonelli, Terry, Stout and Kraus, LLP.

(57) ABSTRACT

A mechanism for always measuring the spatial intensity distribution of a laser beam and displacement of the optical axis of the laser beam is provided so that a measured signal is processed when the laser beam incident on a laser beam shaping optical element is out of a predetermined condition. The shape, diameter and incidence position of the laser beam incident on the laser beam shaping optical element are always kept in the predetermined condition by a spatial filter disposed at the position of a focal point of lenses forming a beam expander disposed in the optical axis, on the basis of a result of the signal processing.

In this manner, silicon thin films uniform in crystallinity can be formed stably with a high yield on an insulating substrate which forms display panels of flat panel display devices.

5 Claims, 14 Drawing Sheets

APPARATUS FOR MANUFACTURING FLAT PANEL DISPLAY DEVICES

BACKGROUND OF THE INVENTION

The present invention relates to an apparatus for manufacturing flat panel display devices composed of thin film transistors formed in such a manner that a semiconductor film formed on an insulating substrate is irradiated with a laser beam to attain improvement of film quality or magnification or pseudo single crystallization of crystal grains.

At present, a liquid crystal display device or an organic electroluminescence (EL) display device forms an image by switching of thin film transistors formed from an amorphous silicon film on a substrate such as a glass substrate or a fused quartz substrate. If a driver circuit for driving the pixel transistors can be formed together with the transistors on the substrate, there is some expectation that reduction in production cost and improvement in reliability will be made remarkably.

In the present situation, the crystallinity of a silicon thin film used for forming active layers of such transistors is however poor, so that the performance of the thin film transistors represented by mobility becomes low. It is difficult to produce circuits satisfying a high speed and a high function. To produce such high-speed high-function circuits, high-mobility thin film transistors are required. To achieve this, it is necessary to improve the crystallinity of the silicon thin film.

Excimer laser annealing has been heretofore used as a method for improving the crystallinity. This method intends to improve mobility by applying an excimer laser beam on an amorphous silicon film (with mobility of 1 $cm^2/Vs$ or less) formed on an insulating substrate such as a glass substrate to transform the amorphous silicon film into a polycrystalline silicon film. The crystal grain size of the polycrystalline film obtained by excimer laser irradiation is the order of hundreds of nm. The mobility of the polycrystalline film is about 150 $cm^2/Vs$. The performance of the polycrystalline film is sufficient to drive pixel thin film transistors but insufficient to be applied to thin film transistors for forming high-speed operating circuits such as driver circuits for driving a display panel. Incidentally, the thin film transistors may be hereinafter referred to as "transistors" simply.

Protrusions with a size of from the order of tens of nm to the order to hundreds of nm are formed in grain boundaries. The protrusions cause reduction in transistor with stand voltage. Moreover, the process margin of the excimer laser beam is narrow because the pulse energy of the excimer laser beam varies widely. Moreover, there are disadvantages as follows. That is, the equipment cost for excimer laser irradiation is high because toxic gas must be used. In addition, the running cost for excimer laser irradiation is very high because an expensive oscillator tube must be exchanged periodically.

As a method for solving these problems, a method in which a silicon thin film is irradiated with a laser beam in such a manner that the second harmonic of a pulse-duration-controlled continuous-wave (CW) solid-state laser modulated by an electro-optical (EO) modulator is condensed linearly while the silicon thin film is scanned with the laser beam has been disclosed in Patent Document 1. This method intends to increase the crystal grain size by elongating the melting duration of silicon and accelerating reduction in cooling rate.

In the aforementioned background art, mobility higher than 500 $cm^2/Vs$ is obtained in such a manner that an amorphous silicon thin film formed on a glass substrate is scanned with the second harmonic of a laser diode (LD)-pumped CW solid-state laser beam to grow crystals in the scanning direction of the laser beam. The polycrystalline film obtained thus has no protrusion. If the silicon thin film having this degree of mobility is obtained, driver circuits of sufficient performance can be formed, so that a so-called "system-on" panel can be achieved.

[Patent Document 1] Japanese Patent Laid-Open No. 2003-124136

[Patent Document 2] Japanese Patent Laid-Open No. 2003-53578

[Patent Document 3] Japanese Patent Laid-Open No. 283933/1999

SUMMARY OF THE INVENTION

A laser beam oscillated by a laser oscillator has a Gaussian function type spatial intensity distribution. Accordingly, if a silicon thin film is irradiated with a laser beam having such a Gaussian function type spatial intensity distribution to improve the quality of the silicon thin film by laser irradiation, a silicon film non-uniform in crystallinity is generated because the melting duration in the central portion of the irradiated region is different from the melting duration in the end portion of the irradiated region. As a result, it is impossible to obtain a silicon film of desired performance. That is, it is necessary to use some laser beam shaping means for making the spatial intensity distribution of the irradiation laser beam uniform or shaping the laser beam into a desired shape.

The LD-pumped solid-state laser beam has a very long coherence length, that is, very high coherence. Accordingly, if beam splitting type laser beam shaping means such as a multi-lens array is applied as represented by an excimer laser beam shaping optical system used in low-temperature polysilicon mass production technology at present, it is very difficult to shape the intensity distribution of the laser beam to a distribution suitable for irradiation of a silicon film because the distribution is affected by diffraction occurring at the time of splitting of the laser beam and interference occurring at the time of synthesizing the split laser beam components. Therefore, a single optical element such as a diffractive optical element or a Powell's lens is preferably used as an optical element for shaping the solid-state laser beam.

This method however has the following problem to be solved. That is, very important factors for obtaining a desired intensity distribution by using a single optical element of the type of shaping the spatial intensity distribution of the laser beam, that is, by using a diffractive optical element or a Powell's lens are as follows. Firstly, the spatial intensity distribution and beam diameter of the incident laser beam must satisfy the designed incidence condition for the optical element strictly. Secondly, the position of the laser beam incident on the laser beam shaping optical element must coincide with the designed position. If one of these factors is not satisfied, the intensity distribution of the laser beam comes out of the desired distribution.

Because a mass-production apparatus is provided on the assumption that the apparatus will operate for a long time, sufficient measures must be taken to suppress variation of laser beam characteristic induced by a large number of factors by which the intensity distribution, optical axis and beam diameter of the laser beam will be changed with the passage of time. Examples of the factors are misalignment of a cavity resonator in an oscillator, thermal distortion of a laser beam medium, and degradation of an optical system. The fact that the intensity distribution of the laser beam applied on the silicon film comes out of the desired distribution means the fact that the crystallinity of the formed silicon film becomes non-uniform.

If the aforementioned crystalline film is used for producing TFTs and flat panel display devices, it is impossible to incorporate transistors of sufficient performance because of non-uniformity of crystallinity. This causes operating failure in circuits, irregularity in display luminance, and so on. As a result, there is a problem that the production yield is reduced. To solve this problem, various laser beam variation control systems have been proposed.

For example, a technique for measuring and estimating a beam profile and feedback-controlling the relative position of a lens of an expander in accordance with the displacement of the beam profile from a reference profile has described in Patent Document 2. In this technique, it is however impossible to solve the problem of shape change in spatial intensity distribution because this is a technique for changing only the beam diameter of the laser beam.

For example, a technique for driving a reflective mirror to adjust the intensity distribution to an optimum distribution to eliminate the irradiation energy intensity change caused by optical axis misalignment at the time of exchanging the excimer laser gas or at the time of exchanging a transparent window has been disclosed in Patent Document 3. It is however impossible to restore the angle, position, etc. of the incident laser beam relative to a homogenizer, to a desired position because one mirror is used for optical axis alignment. As a result, the optical axis misalignment cannot be eliminated.

An object of the present invention is to solve the aforementioned problems, that is, to provide a flat panel display deice manufacturing apparatus in which a silicon crystal film of uniform performance can be formed stably while the spatial intensity distribution, beam diameter and optical axis of a laser beam can be always kept in a desired state when the apparatus operates for a long time. As a result, the object of the invention is to improve the yield in a process for manufacturing flat panel display devices.

To achieve the foregoing object, the invention provides a manufacturing apparatus used for manufacturing flat panel display devices, which comprises: a laser beam shaping optical element by which a laser beam used for irradiating a silicon thin film is shaped into a spatial intensity distribution suitable for forming uniform crystallinity; spatial intensity distribution/beam diameter measuring means for measuring the spatial intensity distribution and beam diameter of the laser beam incident on the laser beam shaping optical element; laser beam incidence position detection means for detecting the position of the laser beam incident on the laser beam shaping optical element; signal processing means for comparing the measured spatial intensity distribution, beam diameter and incidence position of the laser beam with reference spatial intensity distribution, beam diameter and incidence position of the laser beam; and control means for correcting the spatial intensity distribution, beam diameter and incidence position of the laser beam to be reference values on the basis of a result given from the signal processing means.

According to the flat panel display device manufacturing apparatus of the invention for achieving the aforementioned method, the silicon thin film can be stably irradiated with the laser beam having a desired spatial intensity distribution, so that silicon thin films having uniform crystallinity can be formed in high yield.

According to the flat panel display device manufacturing apparatus of the invention, when a solid-state laser beam of high coherence and a solid-state laser beam shaping optical element very sensitive to irregular change in the intensity distribution, optical axis and beam diameter of the incident laser beam are used for improving the quality of a silicon film while the intensity distribution of the laser beam incident on the laser beam shaping optical element or the laser beam shaped by the laser beam shaping optical element is always monitored, the number of bad panels can be reduced while the uniformity of the laser beam applied on the silicon film can be kept high.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF PREFERRED EMBODIMENTS

Embodiments of the present invention will be described below in detail with reference to the drawings.

[Embodiment 1]

Figure 1:
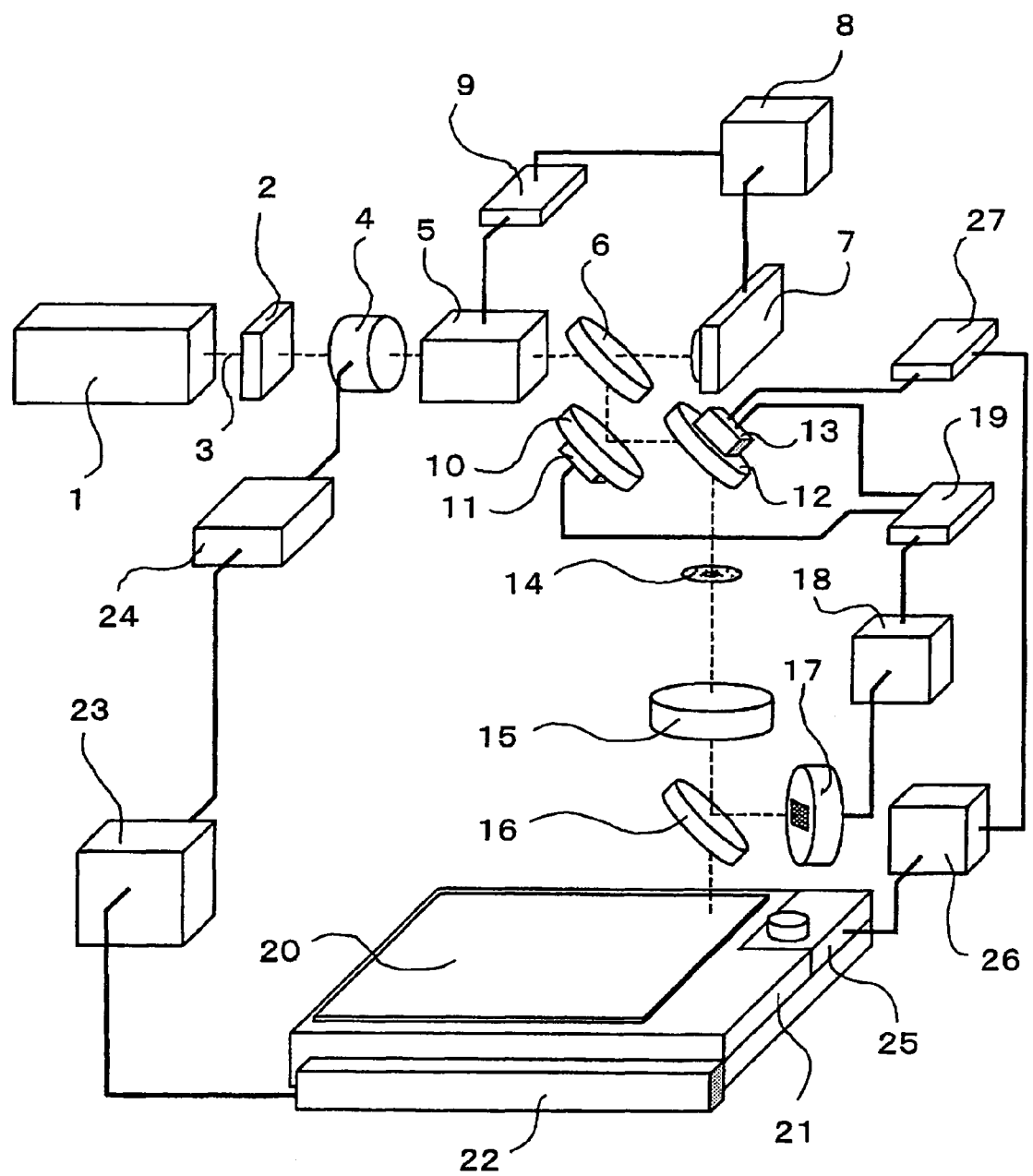
FIG. 1 is a perspective view showing the schematic configuration of a laser annealing apparatus which is Embodiment 1 of an apparatus for manufacturing flat panel display devices according to the invention.

FIG. 1 is a perspective view showing the schematic configuration of a laser annealing apparatus as Embodiment 1 of an apparatus for manufacturing flat panel display devices according to the invention. The laser annealing apparatus comprises a laser diode (LD)-pumped continuous-wave (CW) solid-state laser 1, a neutral-density (ND) filter 2, an electro-optical (EO) modulator 4, a spatial filter and beam expander 5, a laser beam splitting system 6, a beam profiler 7, a signal processing unit 8, a driver 9, optical axis alignment mirrors 10 and 12, an iris 14, a laser beam shaping optical element 15, a laser beam splitting system 16, a laser beam spatial intensity distribution detecting system 17, a signal processing unit 18, a driver 19, a glass substrate 20, a stage 21, a linear encoder (also referred to as linear scale) 22, a controller 23, a driver 24, a beam profiler 25, a signal processor 26, and a driver 27. The LD-pumped CW solid-state laser 1 is used as a laser source. The ND filter 2 controls a continuous-wave (CW) laser beam 3 output from the LD-pumped CW solid-state laser 1. The EO modulator 4 temporally modulates in amplitude the laser beam 3. The spatial filter and beam expander 5 controls the laser beam 3 so that the spatial intensity distribution and beam diameter of the laser beam 3 are always kept constant stably. The laser beam splitting system 6 splits part of the laser beam 3. The beam profiler 7 measures the spatial intensity distribution of the split laser beam. The signal processing unit 8 processes the spatial intensity distribution signal measured by the profiler 7 to extract the beam diameter and spatial intensity distribution shape and compare the extracted shape with a reference value. The driver 9 drives the beam expander on the basis of a result of the signal processing. The optical axis alignment mirrors 10 and 12 include driving mechanisms 11 and 13 respectively. The iris 14 aligns the optical axis. The laser beam splitting system 16 splits part of the laser beam output. The laser beam spatial intensity distribution detecting system 17 detects the spatial intensity distribution of the split laser beam. The signal processing unit 18 processes the signal detected by the detecting system 17 as occasion demands. The driver 19 drives the driving mechanisms 11 and 13. The glass substrate 20 includes a silicon thin film mounted thereon. The stage 21 is used so that the substrate 20 is placed on the stage 21. The linear encoder 22 detects the position of the stage 21. The controller 23 counts pulse signals generated by the linear encoder 22 and sends a control signal to the driver 24 so that the EO modulator 4 is driven whenever the number of counted pulses reaches a predetermined number. The beam profiler 25 measures the spatial intensity distribution of the laser beam shaped by the shaping optical element 15. The signal processor 26 compares the spatial intensity distribution measured by the profiler 25 with a reference intensity distribution. The driver 27 drives the driving mechanism 13.

A laser oscillator for generating a continuous-wave (CW) laser beam with an ultraviolet or visible light wavelength is used as the laser oscillator 1. Especially, the second harmonic (wavelength: 532 nm) of a laser diode-pumped $YVO_4$ laser beam or laser diode-pumped YAG laser beam is preferred from the point of view of output capacity, output stability, etc. The laser beam is however not limited thereto. For example, an argon laser beam, the third or fourth harmonic of an $YVO_4$ or YAG laser beam or a beam emitted from a plurality of semiconductor lasers coupled by fibers may be used.

The EO modulator 4 may be replaced by an acousto-optical (AO) modulator. Although the AO modulator generally has a disadvantage that the driving frequency of the AO modulator is lower than that of the EO modulator and that the diffractive efficiency of the AO modulator is slightly low to be from 70% to 80% compared with that of the EO modulator, the AO modulator can be used. When a modulator such as an EO modulator 4 or an AO modulator is used in this manner, laser irradiation of a subject can be started at an arbitrary point of time (or position) and can be terminated at an arbitrary point of time after arbitrary output change in the condition that the laser beam is always output from the laser oscillator 1. That is, arbitrary temporal amplitude modulation can be made.

Figure 2:
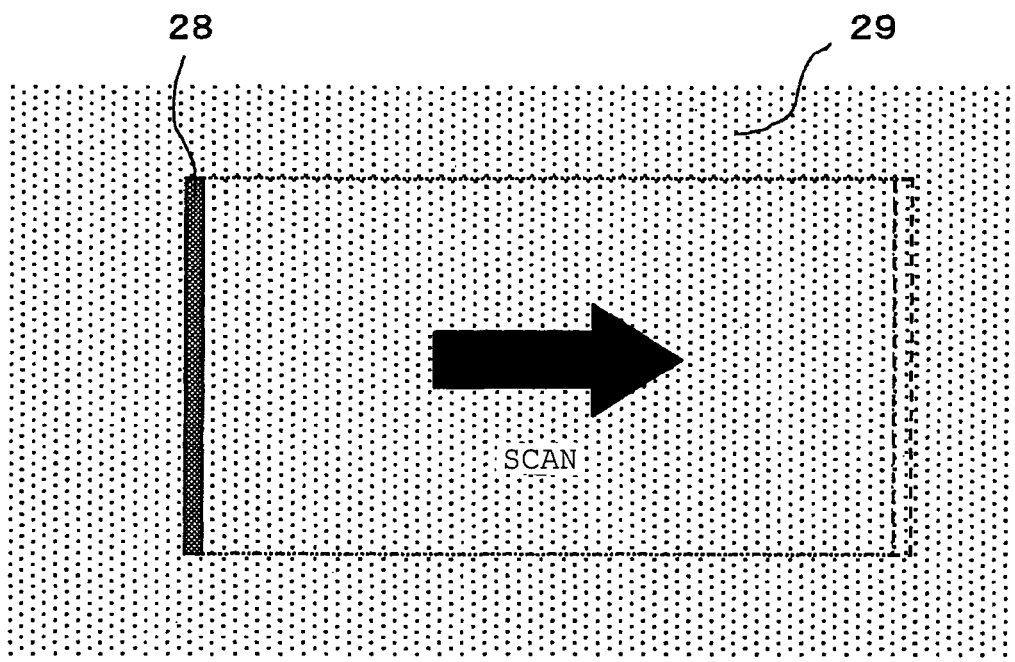
FIGS. 2A and 2B are plan views showing the state of a silicon film before and after formation of a pseudo single crystal by linear laser beam irradiation in Embodiment 1 of the apparatus for manufacturing flat panel display devices according to the invention.
Figure 2:
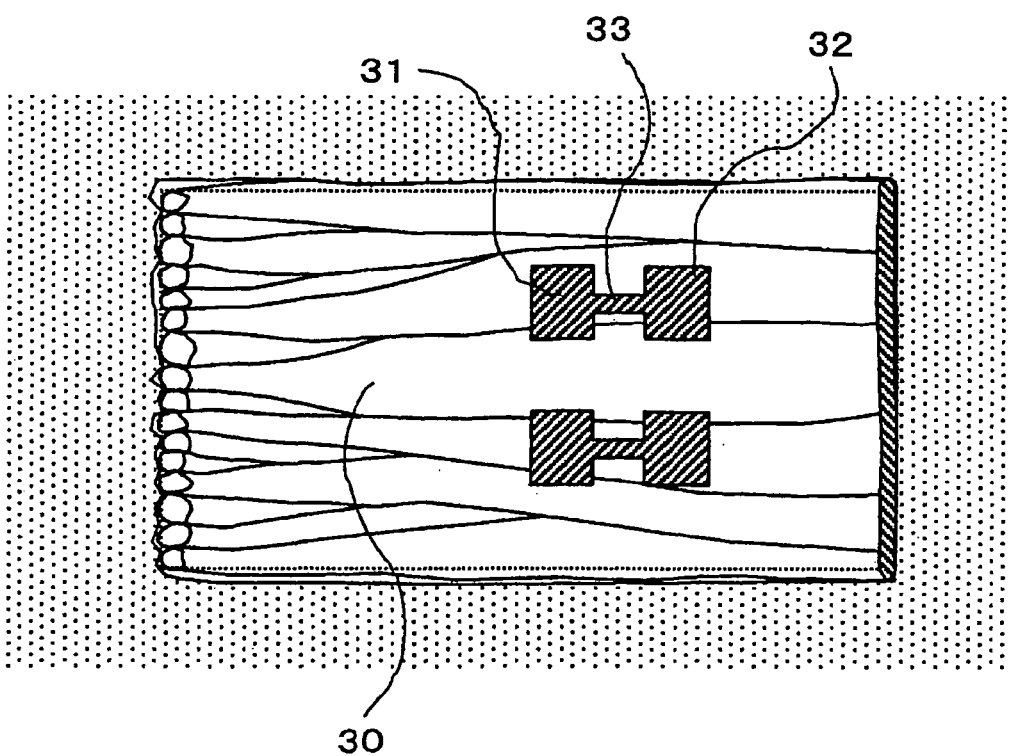

FIGS. 2A and 2B are plan views showing the state of a silicon film before and after a pseudo single crystal is formed by linear laser beam irradiation using Embodiment 1 of the apparatus for manufacturing flat panel display devices according to the invention. The behavior of the silicon film and the shape and performance of a polycrystalline thin film formed when the silicon film is irradiated with the temporally modulated laser beam will be described here. As shown in FIG. 2A, a laser beam 28 condensed linearly is scanned relative to a silicon thin film 29 formed on a substrate to thereby perform crystallization. On this occasion, an amorphous silicon thin film or a polycrystalline silicon thin film may be used as a starting material.

In a process of melting and re-solidifying the silicon thin film irradiated with the linear laser beam 28, as shown in FIG. 2B, crystal grains grow in the scanning direction of the laser beam, that is, grow laterally. The crystal growth stops at a point of time when laser beam irradiation is terminated. If setting is made so that a source region 31, a drain region 32 and a channel region 33 are formed in parallel to the crystal grains grown in the scanning direction of the laser beam when a transistor is formed from the laterally grown crystals 30, a transistor can be formed so that there is no grain boundary crossing the channel region 33. As a result, performance close to that of a transistor formed from a single crystal can be obtained in terms of mobility and variation in threshold voltage. For this reason, the laterally grown polycrystal 30 grown in the scanning direction of the laser beam in the aforementioned manner is hereinafter referred to as "pseudo single crystal".

Figure 3:
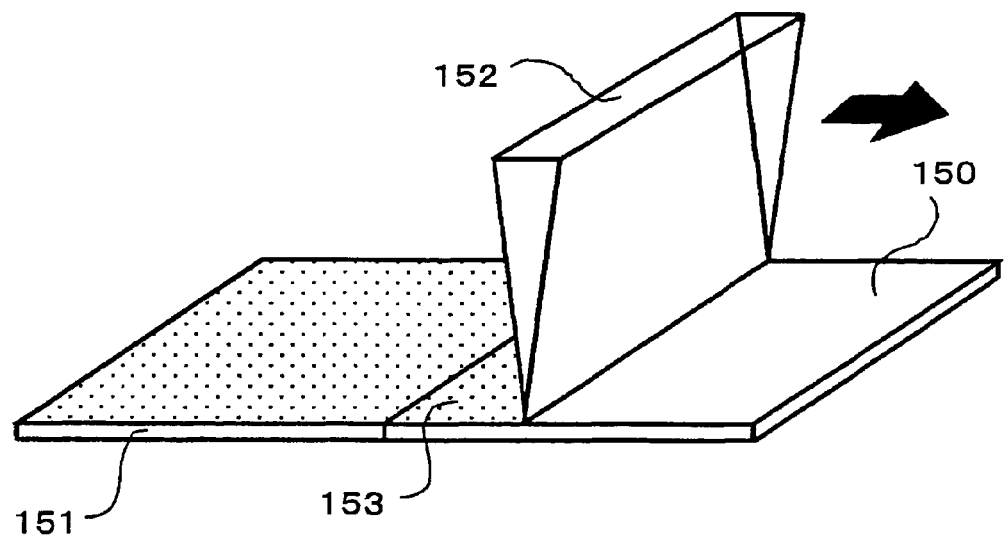
FIGS. 3A to 3C are perspective views for explaining a process for crystallizing the silicon film by laser irradiation in Embodiment 1 of the apparatus for manufacturing flat panel display devices according to the invention.
Figure 3:
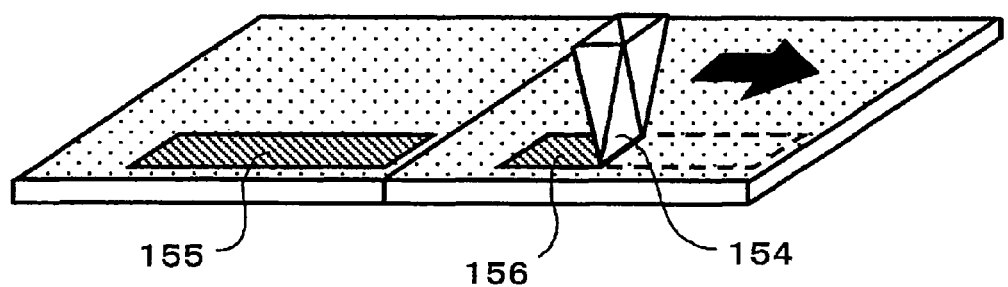
Figure 3:
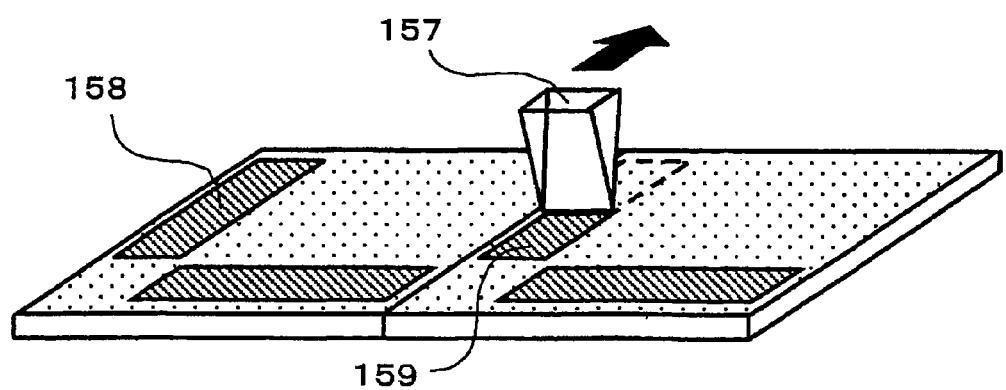

Next, an embodiment of a process for manufacturing display devices by use of the aforementioned manufacturing apparatus will be described. FIGS. 3A to 3C are perspective views for explaining a process of crystallizing a silicon film by laser irradiation using Embodiment 1 of the apparatus for manufacturing flat panel display devices according to the invention. FIG. 3A shows two adjacent panels as representative ones of a plurality of panels manufactured from a large-size substrate. Generally, a large number of panels ranging from tens of panels to hundreds of panels are formed as the panels (display panels) for constituting flat panel display devices. In this embodiment, a glass substrate having an amorphous silicon thin film formed on its principal surface through an insulating thin film is used as a sample of each panel. A display region (pixel region), a gate driver circuit region and a drain driver circuit region are formed on each panel. In this embodiment, there is shown an example in which a pixel transistor having a gate formed from a polycrystalline silicon film is formed in the display region whereas a transistor capable of being driven at a high speed and having a gate formed from a pseudo single crystal is formed in the drain driver circuit region and the gate driver circuit region. Although this embodiment shows the case where only the three regions are polycrystallized to form transistors, a region for providing a circuit such as a D/A converter may be formed as another region than the three regions.

As shown in FIG. 3A, in the condition that a large-size substrate 151 having an amorphous silicon thin film 150 formed thereon is placed on a stage (not shown), the amorphous silicon thin film 150 on the whole surface of the substrate 151 is irradiated with an excimer laser beam 152 while scanned with the excimer laser beam 152 in the direction of the arrow. In this manner, the amorphous silicon thin film 150 is transformed into a polycrystalline silicon thin film 153. Then, as shown in FIG. 3B, only desired regions 155 and 156 are scanned with a linearly condensed solid-state laser beam 154 relatively in the direction of the arrow while the laser beam 154 is temporally modulated in amplitude by the EO modulator. In this manner, a pseudo single crystal having performance necessary for forming a drain driver circuit is selectively formed in the desired regions 155 and 156. Although scanning is generally performed by moving the substrate, the laser beam may be moved.

After crystallization of the drain driver circuit region on the whole surface of the substrate is completed, the substrate is rotated by 90 degrees. Then, as shown in FIG. 3C, desired regions 158 and 159 are irradiated with a linear laser beam 157 temporally modulated in amplitude for forming a gate driver circuit. In this manner, a pseudo single crystal is selectively formed in the desired regions 158 and 159. In this case, annealing may be performed in the condition that the substrate returns to the stage again after the substrate is once taken out of the stage and rotated. Or the optical system may be rotated to thereby rotate the laser beam by 90 degrees. Although this embodiment shows the case where irradiation is performed by turning on/off the laser beam at regular intervals or at arbitrary intervals during scanning, the laser beam may be always on during scanning.

After the scanning is repeated until all the gate driver circuit regions 158 and 159 in the panels are crystallized into pseudo single crystals, irradiation is terminated.

Although this embodiment has been described on the case where crystallization is performed in the condition that the power density of the laser beam is set by power density suitable for formation of a pseudo single crystal, crystallization may be performed in the condition that the power density of the laser beam is set by power density suitable for formation of poly-crystal grains if the crystal required in the gate driver circuit region is a poly-crystal. The process of performing poly-crystallization by excimer laser irradiation and the process of selectively performing pseudo single crystallization by solid-state laser irradiation may be carried out as separate processes in different annealing chambers with respect to the excimer laser and the solid-state laser. Or the two processes may be carried out in one annealing chamber in the condition that laser beams given from the excimer laser optical system and the solid-state laser optical system are led into the annealing chamber.

After the aforementioned operation is repeated until the whole surface of the substrate is scanned, annealing is terminated. As a result, in each panel in the substrate 151, the pixel region is transformed into a polycrystalline silicon film having mobility of about 150 $cm^2/Vs$ while each of the gate driver circuit region and the drain driver circuit region (inclusive of the other peripheral circuit region) is transformed into a polycrystalline silicon (pseudo single crystal silicon) film having mobility of from 300 to 400 $cm^2/Vs$. The embodiment of the manufacturing process has been described above.

The laser beam 3 to be applied on the silicon film is shaped into a linear (or rectangular) beam by the laser beam shaping optical element 15. Generally, a beam output from a gas or solid-state laser oscillator cannot be used directly for laser annealing in this invention because the beam is circular and has a Gaussian energy distribution. If the oscillator output is sufficiently high, an arbitrary shape having a nearly uniform energy distribution can be obtained when the beam diameter is widened sufficiently and a necessary shape is extracted from a relatively uniform portion in the central portion of the beam. The peripheral portion of the beam must be however discarded, so that a large part of energy runs to waste.

To eliminate this disadvantage, the laser beam shaping optical element 15 is used for transforming the Gaussian distribution into a uniform distribution. Any type optical element such as a diffractive optical element or a combination of a Powell's lens and a cylindrical lens can be used as the laser beam shaping optical element 15. Any means may be used as long as the laser beam can be condensed linearly to achieve an energy distribution uniform in the direction of the long dimension of the laser beam or suitable for annealing. The energy distribution in the direction of the short dimension (width) of the laser beam may be uniform or Gaussian. An objective lens (not shown) may be inserted between the laser beam shaping optical element 15 and the glass substrate to reductively project a desired intensity distribution so that the power density can be increased while the intensity distribution of the laser beam 3 shaped by the laser beam shaping optical element 15 is retained.

The intensity distribution of the shaped laser beam and the influence on the polycrystalline silicon thin film formed by laser irradiation will be described below with reference to the drawings in the case where the incidence position of the laser beam incident on the laser beam shaping optical element such as a diffractive optical element or a Powell's lens is displaced from a predetermined position.

Figure 4:
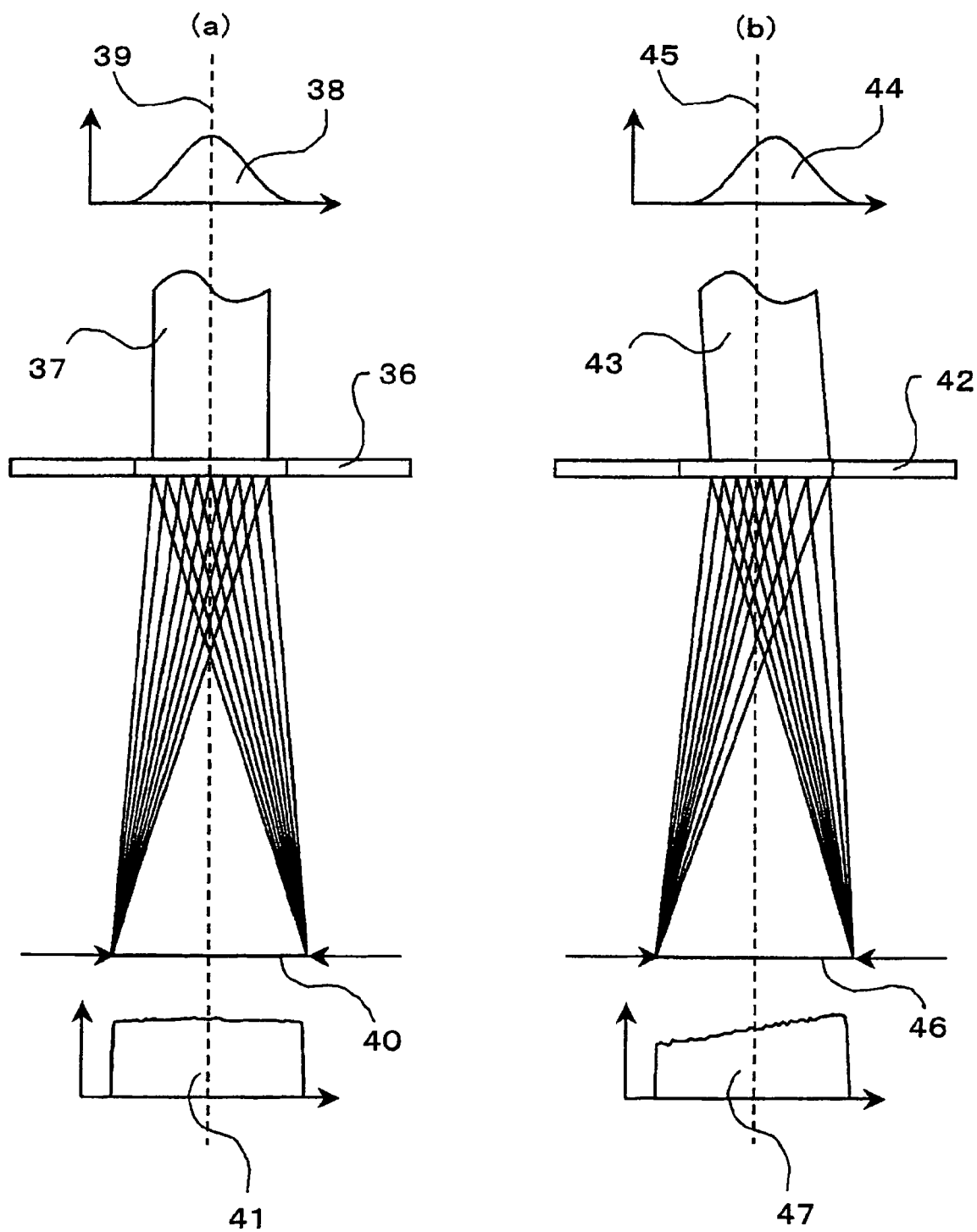
FIGS. 4A and 4B are front (or side) views showing a state in which the intensity distribution of the shaped laser beam varies according to change in the path of the laser beam incident on a diffractive optical element.

FIGS. 4A and 4B are front (or side) views showing a state in which the intensity distribution of the shaped laser beam varies according to change in the path of the laser beam incident on a diffractive optical element. FIG. 4A is a view showing the intensity distribution of the laser beam in the case where the position of the laser beam incident on the diffractive optical element is ideal. The diffractive optical element 36 is designed so that a uniform distribution is formed on a plane of projection when a laser beam having a Gaussian function type intensity distribution is incident on the center of the element. The incident laser beam 37 has a Gaussian function type intensity distribution 38, and the central position and traveling direction of the laser beam 37 coincide with those of an optical axis 39.

The term "optical axis 39" used in this case means an axis passing through the central position of the diffractive optical element 36 and extending in a direction perpendicular to a surface of the diffractive optical element 36. That is the center of the diffractive optical element 36 coincides with the center of the laser beam 37. When the laser beam 37 is incident on the diffractive optical element 36 in the aforementioned condition, the intensity distribution 41 of the shaped laser beam on a plane 40 of projection is made uniform as designed. On the contrary, when the traveling direction of the incident laser beam 43 is displaced from the optical axis 45 passing through the center of the diffractive optical element 42 or the incidence position on the incidence surface of the diffractive optical element 42 is displaced as shown in FIG. 4B, the intensity distribution 47 of the shaped laser beam on a plane 46 of projection collapses to a non-uniform distribution.

Figure 5:
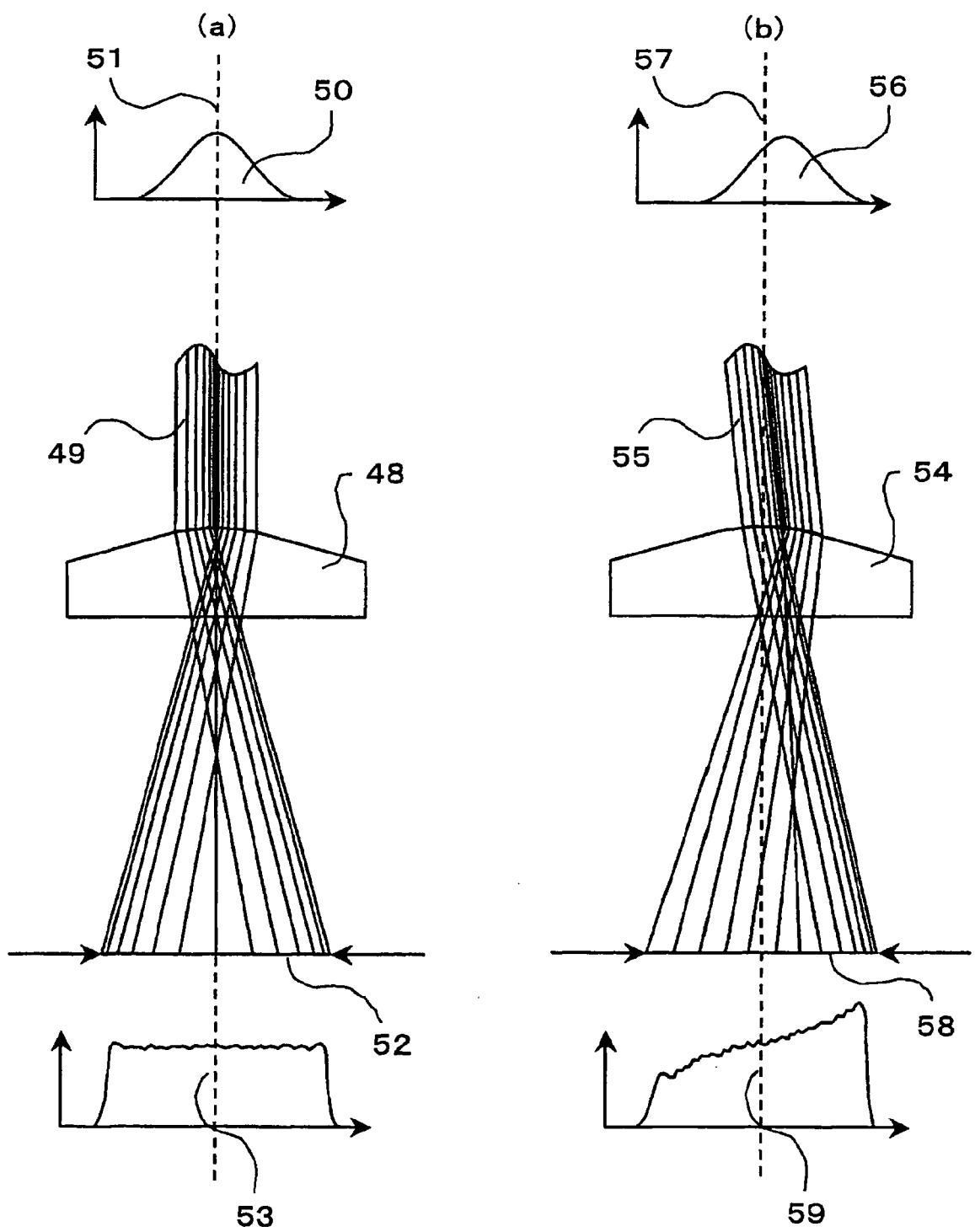
FIGS. 5A and 5B are front (or side) views showing a state in which the intensity distribution of the shaped laser beam varies according to change in the path of the laser beam incident on a Powell's lens.

FIGS. 5A and 5B are front (or side) views showing a state in which the intensity distribution of the shaped laser beam varies according to change in the path of the laser beam incident on a Powell's lens. FIG. 5B shows the case where the position of the laser beam incident on the Powell's lens is displaced from a predetermined position. FIG. 5A is a view showing the intensity distribution of the laser beam in the case where the position of the laser beam incident on the Powell's lens is ideal. The Powell's lens 48 is designed so that a uniform distribution is formed on a plane of projection when a laser beam having a Gaussian function type intensity distribution is incident on the center of the element. The incident laser beam 49 has a Gaussian function type intensity distribution 50, and the central position and traveling direction of the laser beam 49 coincide with those of an optical axis 51. The term "optical axis 51" used in this case means an axis passing through the central position of the Powell's lens 48 and extending in a direction perpendicular to a surface of the Powell's lens. That is, the center of the Powell's lens 48 coincides with the center of the laser beam 49.

When the laser beam 49 is incident on the Powell's lens 48 in the aforementioned condition, the intensity distribution 53 of the shaped laser beam on a plane 52 of projection is made uniform as designed. On the contrary, when the traveling direction of the incident laser beam 55 is displaced from the optical axis 57 passing through the center of the Powell's lens 54 or the incidence position on the incidence surface of the Powell's lens 54 is displaced as shown in FIG. 5B, the intensity distribution 59 of the shaped laser beam on a plane 58 of projection collapses to a non-uniform distribution.

Figure 6:
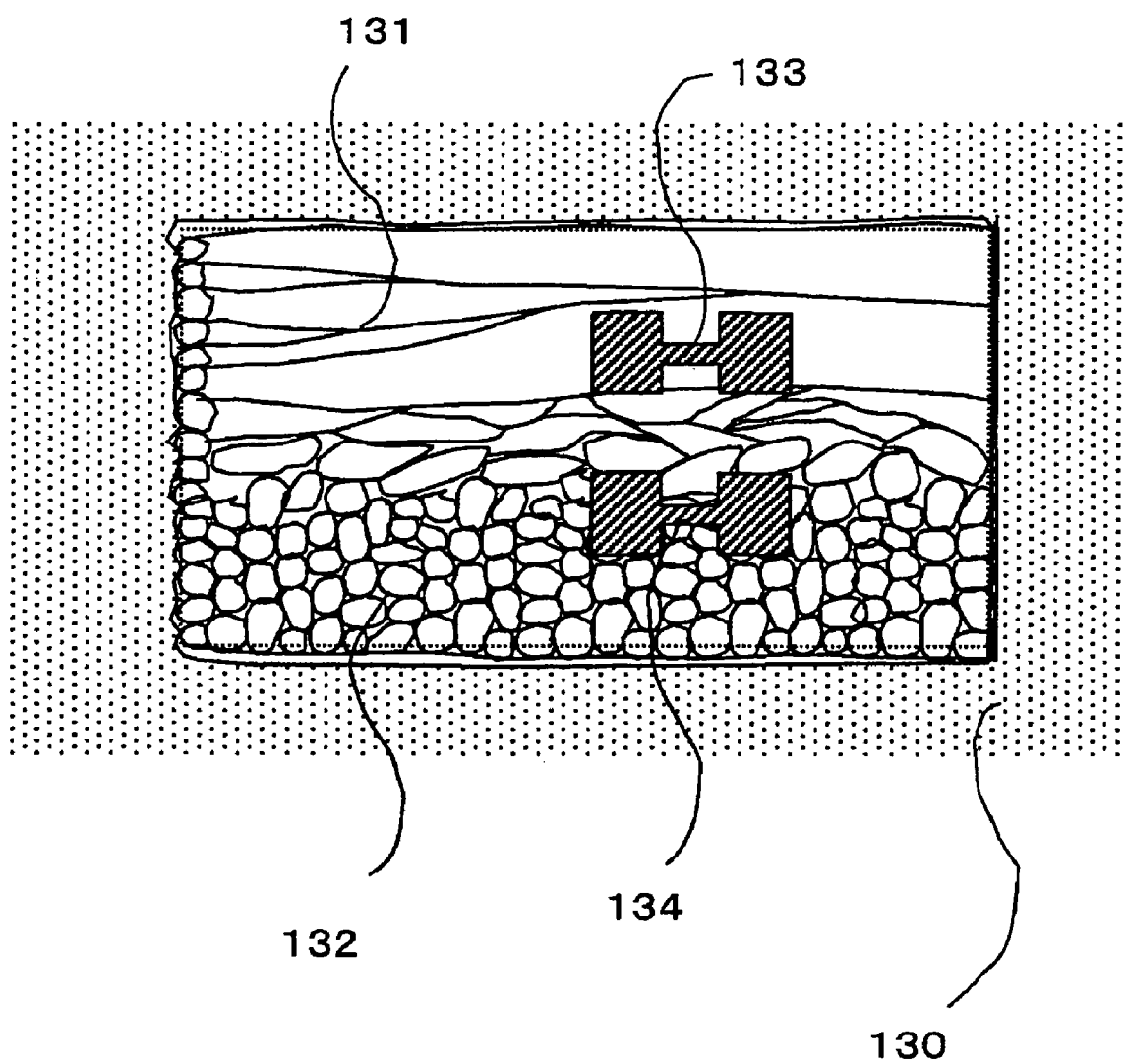
FIG. 6 is a plan view showing the state of crystals formed by crystallization of the silicon film irradiated with the laser beam shaped into a non-uniform spatial intensity distribution in Embodiment 1 of the apparatus for manufacturing flat panel display devices according to the invention.

FIG. 6 is a plan view showing a state of crystal formed by crystallization of a silicon film irradiated with a laser beam shaped into a non-uniform spatial intensity distribution by use of Embodiment 1 of the apparatus for manufacturing flat panel display devices according to the invention. FIG. 6 shows a state of crystal formed by crystallization of a silicon film irradiated with a laser beam having a non-uniform shaped laser beam intensity distribution 47 or 59 as described above. A silicon thin film 130 (an amorphous or polycrystalline thin film may be used as a starting material in this case) formed on a substrate is irradiated while relatively scanned with a linearly condensed laser beam (not shown) having a non-uniform intensity distribution to thereby perform crystallization.

The melting time of the silicon film irradiated with the linear laser beam correlates with the intensity distribution of the irradiation laser beam. When the silicon film is irradiated with a high-intensity laser beam, a crystal 131 having accelerated lateral growth is formed with the elongation of the melting time of the silicon film. On the other hand, when the silicon film is irradiated with a low-intensity laser beam, small grain size crystals 132 are formed because the melting time is too short to accelerate lateral growth sufficiently. If the crystals 131 and 132 are used for forming transistors so that channels 133 and 134 are formed in parallel to crystal grains grown in the laser scanning direction, high mobility can be obtained in the channel 133 of the transistor formed from the crystal 131 because there is no grain boundary in the channel 133, but a disadvantage that characteristic such as mobility or threshold voltage varies occurs in the channel 134 of the transistor formed from the crystals 132 because some grain boundaries cross the channel 134 in the direction of the current flowing in the channel 134.

Figure 7:
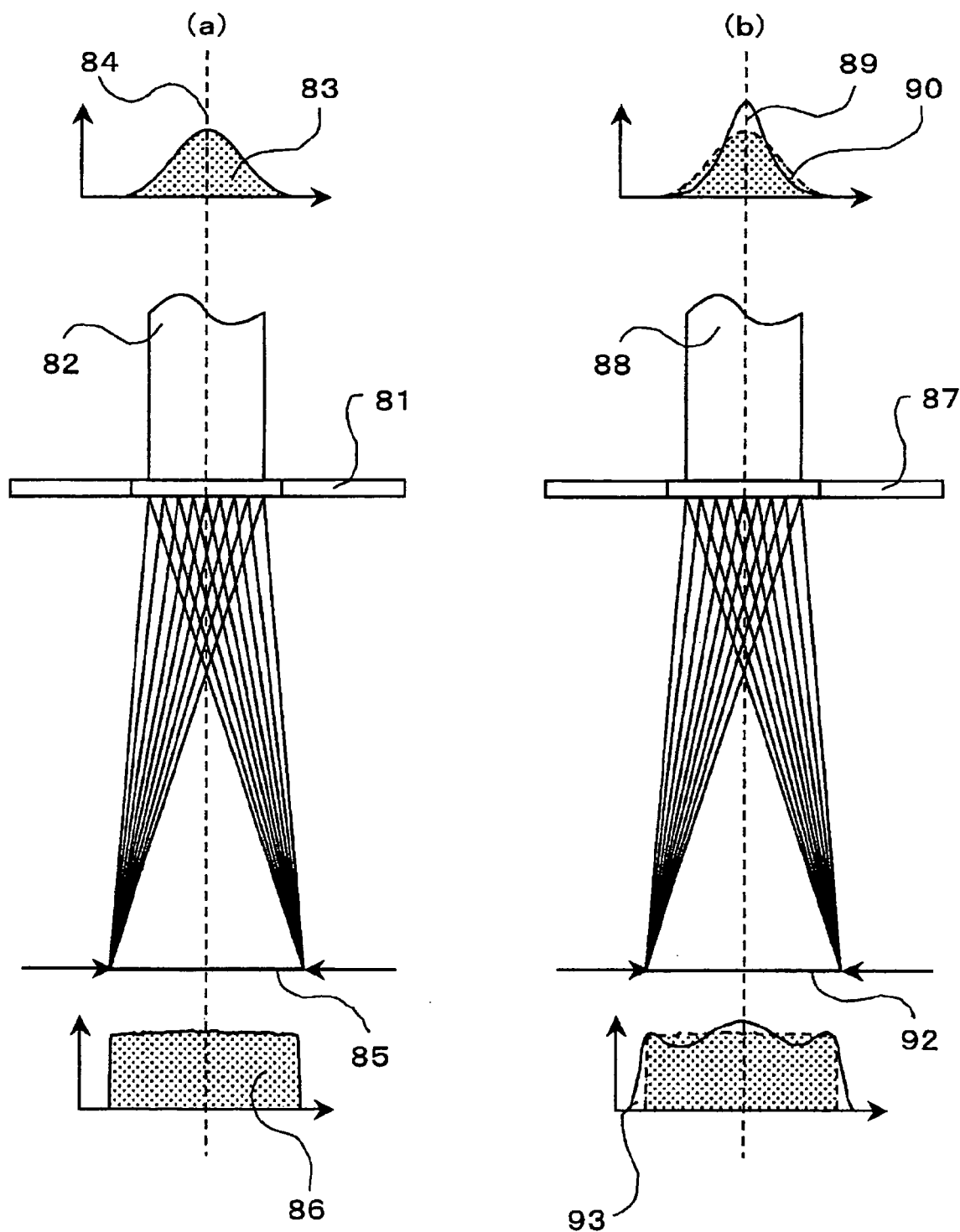
FIGS. 7A and 7B are front (or side) views showing a state in which the intensity distribution of the shaped laser beam varies according to change in the spatial intensity distribution of the laser beam incident on a diffractive optical element.
Figure 8:
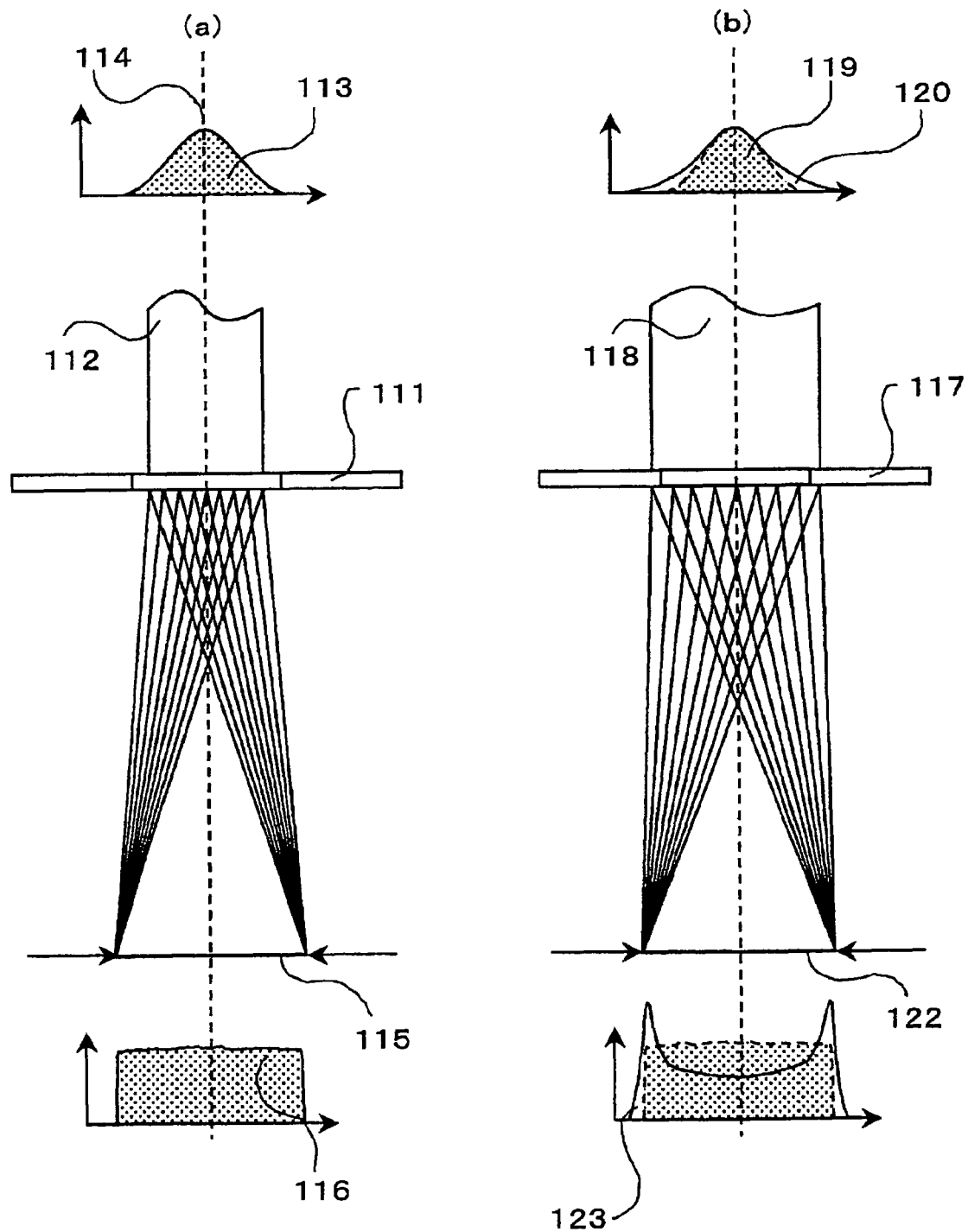
FIGS. 8A and 8B are front (or side) views showing a state in which the intensity distribution of the shaped laser beam varies according to change in the beam diameter of the laser beam incident on the diffractive optical element.

The influence on the intensity distribution of the shaped laser beam will be described with reference to FIGS. 7A, 7B, 8A and 8B in the case where the intensity distribution or beam diameter of the laser beam incident on the laser beam shaping optical element such as a diffractive optical element or a Powell's lens is out of a predetermined value. FIGS. 7A and 7B are front (or side) views showing a state in which the intensity distribution of the shaped laser beam varies according to change in the spatial intensity distribution of the laser beam incident on the diffractive optical element. FIGS. 8A and 8B are front (or side) views showing a state in which the intensity distribution of the shaped laser beam varies according to change in the beam diameter of the laser beam incident on the diffractive optical element.

FIG. 7A is a view showing the intensity distribution of the shaped laser beam in the case where the intensity distribution of the laser beam incident on the diffractive optical element coincides with the intensity distribution assumed at the time of designing the diffractive optical element. The diffractive optical element 81 is designed so that a uniform distribution is formed on a plane of projection when a laser beam having a Gaussian function type intensity distribution is incident on the center of the element. The incident laser beam 82 has a Gaussian function type intensity distribution 83 and the central position and traveling direction of the laser beam 82 coincide with those of an optical axis 84. The term "optical axis 84" used in this case means an axis passing through the central position of the diffractive optical element 81 and extending in a direction perpendicular to a surface of the diffractive optical element. That is, the center of the diffractive optical element 81 coincides with the center of the laser beam 82.

When the laser beam 82 is incident on the diffractive optical element 81 in this condition, the intensity distribution 86 of the shaped laser beam on the plane 85 of projection is such a uniform distribution as designed. However, if the intensity distribution of the laser beam 88 incident on the center of the diffractive optical element 87 is displaced from the predetermined distribution into a distribution 90 in accordance with change with the passage of time as shown in FIG. 7B, the intensity distribution 93 of the shaped laser beam on the plane 92 of projection is collapsed to a non-uniform distribution. Incidentally, the reference numeral 89 designates an optical axis.

FIG. 8A is a view showing the intensity distribution of the shaped laser beam in the case where the beam diameter of the laser beam incident on the diffractive optical element coincides with the beam diameter of the laser beam assumed at the time of designing the diffractive optical element. The diffractive optical element 111 is designed so that a uniform distribution is formed on a plane of projection when a laser beam having a Gaussian function type intensity distribution is incident on the center of the element. The incident laser beam 112 has a Gaussian function type intensity distribution 113 and the central position and traveling direction of the laser beam 112 coincide with those of an optical axis 114. The term "optical axis 114" used in this case means an axis passing through the central position of the diffractive optical element 111 and extending in a direction perpendicular to a surface of the diffractive optical element 111. That is, the center of the diffractive optical element 111 coincides with the center of the laser beam 112.

When the laser beam 112 is incident on the diffractive optical element 111 in this condition, the intensity distribution 116 of the shaped laser beam on the plane 115 of projection is such a uniform distribution as designed. However, if the beam diameter of the laser beam 118 incident on the center of the diffractive optical element 117 comes out of the predetermined numerical value by some reason so that the Gaussian function type intensity distribution 119 of the laser beam changes to a Gaussian function type distribution 120 as shown in FIG. 8B, the intensity distribution of the shaped laser beam on the plane 122 of projection is collapsed to a non-uniform distribution.

As described above, the laser beam shaping optical element such as a diffractive optical element or a Powell's lens is remarkably different in properties from a so-called multi-lens array type shaping optical element which uses a plurality of lenses for separating a laser beam into parts so that the separated laser beam parts are mixed on a plane of projection. Generally, in the design of shaping a laser beam by a single optical element, the shape of the element is decided by an operation of accurately deciding the diffractive efficiency of each cell on the element and parameters such as the curvature and thickness of the lens in the condition that the position of the laser beam incident on the element is assumed strictly. If the relative intensity distribution of the laser beam incident on the element is slightly displaced from the designed distribution or if the position of the incident laser beam is slightly displaced from the designed position, the diffractive efficiency of each cell and the degree of focusing vary widely.

That is, when a laser beam is intended to be shaped as designed, only part of the laser beam having its incidence position, intensity distribution form and beam diameter coincident with the designed values is shaped into a desired distribution. Accordingly, when the laser beam shaping optical element is used for performing laser beam irradiation in order to obtain a silicon film of stable performance, there is a problem that a mechanism for always holding the intensity distribution of the laser beam stably during the operation of the apparatus must be provided. The laser annealing apparatus adapted for performing the method for manufacturing display devices according to the invention includes the following mechanism to solve this problem. The form of the mechanism will be described below in detail with reference to the drawing.

In FIG. 1, the intensity distribution of the laser beam incident on the laser beam shaping optical element 15 is always kept constant by use of the beam expander 5 and the mirrors 10 and 12. The beam expander 5 has a spatial filter. The mirrors 10 and 12 have drive mechanisms 11 and 13 respectively. The position of the laser beam incident on the laser beam shaping optical element 15 can be kept constant by the drive mechanisms 11 and 13. The beam expander 5 has a mechanism for adjusting the spatial intensity distribution of the laser beam. The mirrors 10 and 12 have mechanisms for adjusting the position of the laser beam incident on the laser beam shaping optical element 15 (i.e. for adjusting the optical axis of the laser beam).

Figure 9:
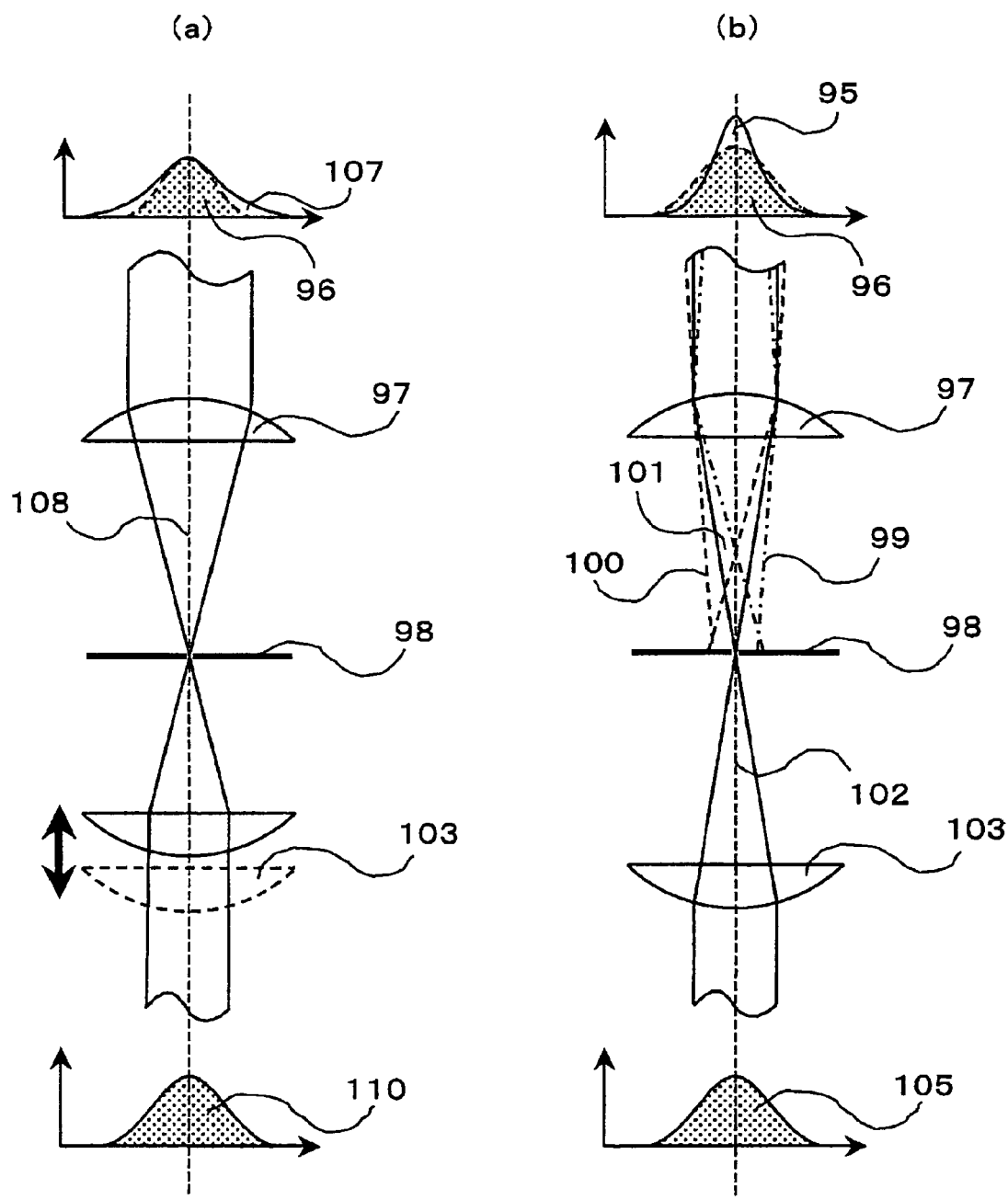
FIGS. 9A and 9B are perspective views for explaining examples of a process for correcting the spatial intensity distribution and beam diameter of the laser beam incident on the laser beam shaping optical element in Embodiment 1 of the apparatus for manufacturing flat panel display devices according to the invention.

A detection and adjustment method in an embodiment of the invention will be described first with reference to FIGS. 9A and 9B in the case where the intensity distribution of the laser beam is displaced from the predetermined one in terms of both shape and beam diameter. FIGS. 9A and 9B are front (or side) views for explaining an example of a process for correcting the spatial intensity distribution and beam diameter of the laser beam incident on the laser beam shaping optical element in Embodiment 1 of the apparatus for manufacturing flat panel display devices according to the invention. As shown in FIG. 9A, the spatial filter-including beam expander 5 has two convex lenses 97 and 103, and a metal sheet 98 having a hole with a diameter of the order of microns. The convex lens 103 is retained by a lens retaining mechanism (not shown) driven by a stepping motor. The convex lens 103 is formed so that it can move in directions of the arrows in parallel to the optical axis 108.

The beam expander 5 is formed as a so-called Kepler type expander/collimator structure in which the laser beam 108 once condensed by one convex lens 97 is received by the other convex lens 103. That is, the beam expander 5 has a mechanism for adjusting the beam diameter by changing the relative distance between the convex lenses in parallel to the optical axis. The metal sheet 98 having a hole is disposed at the focal point of the convex lenses so that the metal sheet 98 serves as a spatial filter.

As shown in FIG. 9B, the spatial filter made of the metal sheet 98 has a mechanism for transmitting only a light component most condensed at the focal point, that is, transmitting only a basic mode component 101 but blocking the other light component different in the focal point, that is, blocking the other mode components (spatial noise) 99 and 100 among components of the laser beam condensed by the convex lens 97 when the intensity distribution of the incident laser beam is changed from an original Gaussian function type intensity distribution 96 to a distribution 95 having a collapsed shape because high-order mode components besides the basic mode component are contained in the incident laser beam or spatial noise is contained in the incident laser beam due to factors such as change in the excitation optical system of the laser oscillator with the passage of time, positional displacement, thermal distortion of the laser rod, and so on. When the spatial filter (metal sheet 98) is always inserted, the laser beam incident on the laser beam shaping optical element can be always kept in a basic mode Gaussian function type intensity distribution. The spatial filter used herein may be shaped so that the diameter of the hole is fixed. Alternatively, the spatial filter may be shaped like an iris so that the diameter of the hole can be changed to adjust the spatial mode of the laser beam and the laser output simultaneously.

In FIG. 1, the laser beam transmitted through the beam expander 5 is partially separated by the laser beam splitting system 6 such as a beam splitter or a glass sheet disposed in the optical axis. The split part is measured by the profiler 7. The measured values are subjected to processing such as A/D conversion, Gauss fitting, etc. by the detection signal processing unit 8 as occasion demands. In this manner, information concerning the shape of the intensity distribution of the beam and the diameter of the beam is extracted. Then, the shape and diameter value are compared with a predetermined shape (Gaussian function type) and a predetermined numerical value (beam diameter $1/e^2$ as much as the standard intensity) registered in advance. In this manner, the difference of the measured beam diameter from the predetermined value is calculated. When the difference (change in beam diameter) reaches a certain threshold or a higher value, the signal processing unit 8 sends a pulse signal to the lens retaining/driving system mounted with the convex lens 103 so that the difference can approach zero. In this manner, the stepping motor is driven to change the magnifying power of the expander to thereby adjust the beam diameter.

In this manner, the magnifying power of the expander is adjusted until the beam diameter of the output laser beam 110 returns a predetermined value. At a point of time when the beam diameter of the output laser beam 110 returns the predetermined value, the adjustment is terminated. In this embodiment, there is shown the case where the beam diameter of the laser beam 107 (FIG. 9A) incident on the beam expander 5 is widened compared with the Gaussian function type intensity distribution 96 having a predetermined beam diameter. It is a matter of course that the same adjusting method may be applied to the case where the beam diameter is narrowed. Although this embodiment has been described on the case where the downstream side convex lens 103 which is one of the two convex lenses for forming the beam expander has a driving mechanism, the invention may be applied to the case where the upstream side convex lens 97 has a driving mechanism for adjusting the beam diameter. Incidentally, when the upstream side convex lens 97 is driven, it is necessary to mount the spatial filter 98 in the driving mechanism to keep the relative distance between the lens 97 and the spatial filter 98 constant because the relative distance between the lens 97 and the spatial filter 98 will be changed otherwise.

In the case where the numerical expression calculated when the shape of the spatial intensity distribution is extracted as a numerical expression by fitting in the processing in the signal processing unit 8 is far by a predetermined value from a Gaussian function, a warning of this fact is issued and a mechanism for interrupting the operation is added as occasion demands.

Although this embodiment has been described on the case where the intensity distribution of the laser beam separated just after the beam expander is measured, the place where the laser beam is detected may be just before incidence on the laser beam shaping optical element 15. In this case, adjustment can be made more accurately because a spatial intensity distribution close to that of an actual incident laser beam can be measured. After adjustment of the beam diameter, the spatial intensity distribution of the shaped laser beam may be measured by the beam profiler 25 disposed on the substrate stage 21 as occasion demands, so that a result of the measurement is fed back to the expander 5 to adjust the arrangement of the lens 103 finely. The detection and adjustment method has been described above on the case where the laser beam is split and the intensity distribution of the laser beam is displaced from the predetermined shape and beam diameter.

[Embodiment 2]

Next, a mechanism for detecting the displacement in the position of the laser beam incident on the laser beam shaping optical element and correcting the incidence position to a predetermined incidence position will be described as Embodiment 2 of the invention. The outline and configuration of this embodiment will be described first with reference to FIG. 10. The correcting method using the incidence position correcting mechanism according to this embodiment will be then described in detail with reference to FIGS. 11 to 15.

Figure 10:
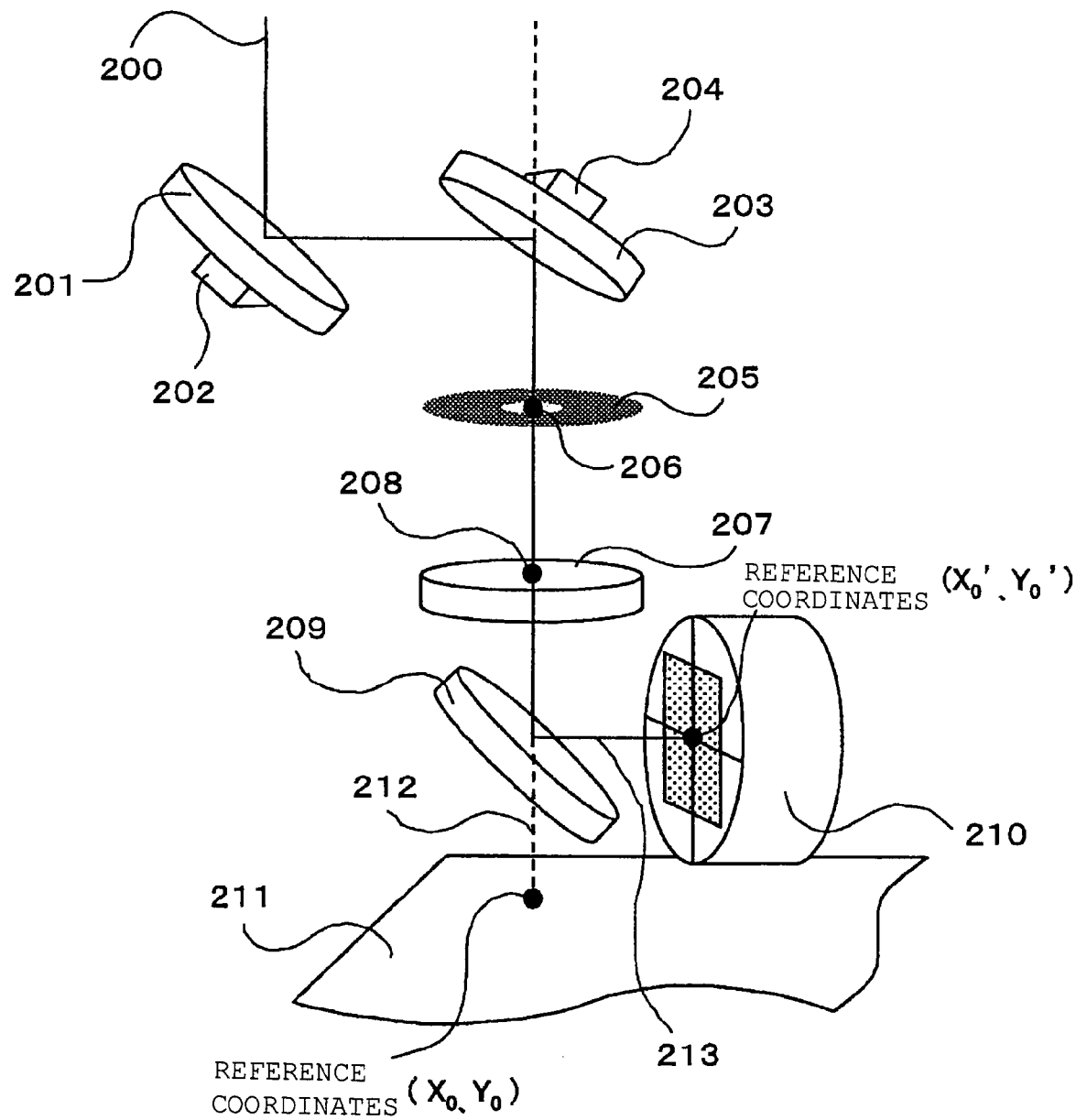
FIG. 10 is a perspective view for explaining an example of a process for correcting the position of the laser beam incident on the laser beam shaping optical element in Embodiment 2 of the apparatus for manufacturing flat panel display devices according to the invention.

FIG. 10 is a perspective view for explaining an example of a process for correcting the position of the laser beam incident on the laser beam shaping optical element in Embodiment 2 of the apparatus for manufacturing flat panel display devices according to the invention. FIG. 10 shows the schematic configuration of a laser beam irradiation position control system and an irradiation optical system corresponding to this embodiment in the flat panel display device manufacturing apparatus shown in FIG. 1. This control system includes at least two optical axis alignment mirrors 201 and 203, driving mechanisms 202 and 204 for driving the mirrors 201 and 203 on the basis of a received pulse signal, an iris 205, a beam splitter 209, a beam profiler 210, a signal processing unit (not shown) for processing a signal detected by the beam profiler 210, and a mirror driving mechanism driver (not shown) for sending a pulse signal to the mirror driving mechanisms on the basis of the processed signal. The aforementioned constituent members are disposed as shown in FIG. 10 relative to the laser beam shaping optical element 207 and the stage 211.

When the optical axis of the laser beam is displaced from a predetermined optical axis 200, the displacement of the optical axis is detected as the displacement of the laser beam irradiation position on a photon acceptance surface of the beam profiler 210. A result of the detection is subjected to signal processing as occasion demands. Feedback control of the optical axis alignment mirrors 201 and 203 is made according to the result of the detection to correct the optical axis to the predetermined optical axis 200. The mirror 201 having the driving mechanism 202 and the mirror 203 having the driving mechanism 204 can align the optical axis with respect to at least two axes, that is, an arbitrary axis (hereinafter referred to as X axis) and an axis (hereinafter referred to as Y axis) perpendicular to the X axis. The laser beam advancing along the predetermined optical axis 200 is reflected on surfaces of the mirrors 201 and 203. After the reflected laser beam passes through the center 206 of the hole of the iris 205, the laser beam is made incident on the central point 208 of the laser beam shaping optical element 207 perpendicularly to the element surface.

The diameter of the hole in the iris 205 disposed in the optical axis 200 is variable. The hole can be opened sufficiently largely compared with the beam diameter at any time except for the time of adjustment. The laser beam shaping optical element 207 is disposed so that the shaped laser beam 212 can form a desired spatial intensity distribution suitable for annealing just on the stage 211. The laser beam shaping optical element 207 is supported by a retaining/driving mechanism (not shown). The mechanism is provided so that the laser beam shaping optical element 207 can be moved so as be far from the optical axis during adjustment and that the laser beam shaping optical element 207 can be restored to a predetermined position accurately after completion of adjustment.

The beam splitter 209 for splitting part of the laser beam to measure the intensity distribution of the split laser beam is disposed between the laser beam shaping optical element 207 and the stage 211 to make an angle of 45 degrees with respect to the optical axis. The split laser beam 213 is detected by the beam profiler 210 which can detect the intensity distribution of the laser beam as two-dimensional spatial information. The coordinates of the laser beam 212 on the stage 211 after the laser beam 212 has passed through the center 206 of the iris 205 and the center 208 of the laser beam shaping optical element 207 are defined as reference coordinates ($X_0, Y_0$). The coordinates of the laser beam 213 on the profiler 210 after the laser beam 213 has been split by the splitter 209 are defined as reference coordinates ($X_0', Y_0'$).

The center 206 of the iris 205, the center 208 of the laser beam shaping optical element 207 and the point of the reference coordinates ($X_0, Y_0$) on the stage 211 are perfectly on the same and one optical axis. The center 206 of the iris 205, the center 208 of the laser beam shaping optical element 207 and the point of the reference coordinates ($X_0', Y_0'$) on the profiler 210 are perfectly on one and the same optical axis through the beam splitter 209. The respective constituent members are arranged so that the coordinates ($X_0, Y_0$) are equivalent to the coordinates ($X_0', Y_0'$) through the beam splitter 209.

That is, when the splitter 209 and the profiler 210 are arranged so that the distance between the beam splitter 209 and the stage 211 is equivalent to the distance between the splitter 209 and the photon acceptance surface of the profiler 210, the spatial intensity distribution of the laser beam at the point of the reference coordinates ($X_0, Y_0$) on the stage can be observed by the profiler 210. The splitter 209 and the profiler 210 are fixed. When the optical axis 200 of the laser beam is displaced from a predetermined direction, displacement from the reference coordinates ($X_0, Y_0$) is detected as displacement of the laser irradiation position from the reference coordinates ($X_0, Y_0$) on the splitter 210. Accordingly, when the tilt of each mirror is adjusted so that the irradiation position on the profiler 210 is returned to the point of the reference coordinates, the optical axis can be restored to the predetermined state.

Figure 11:
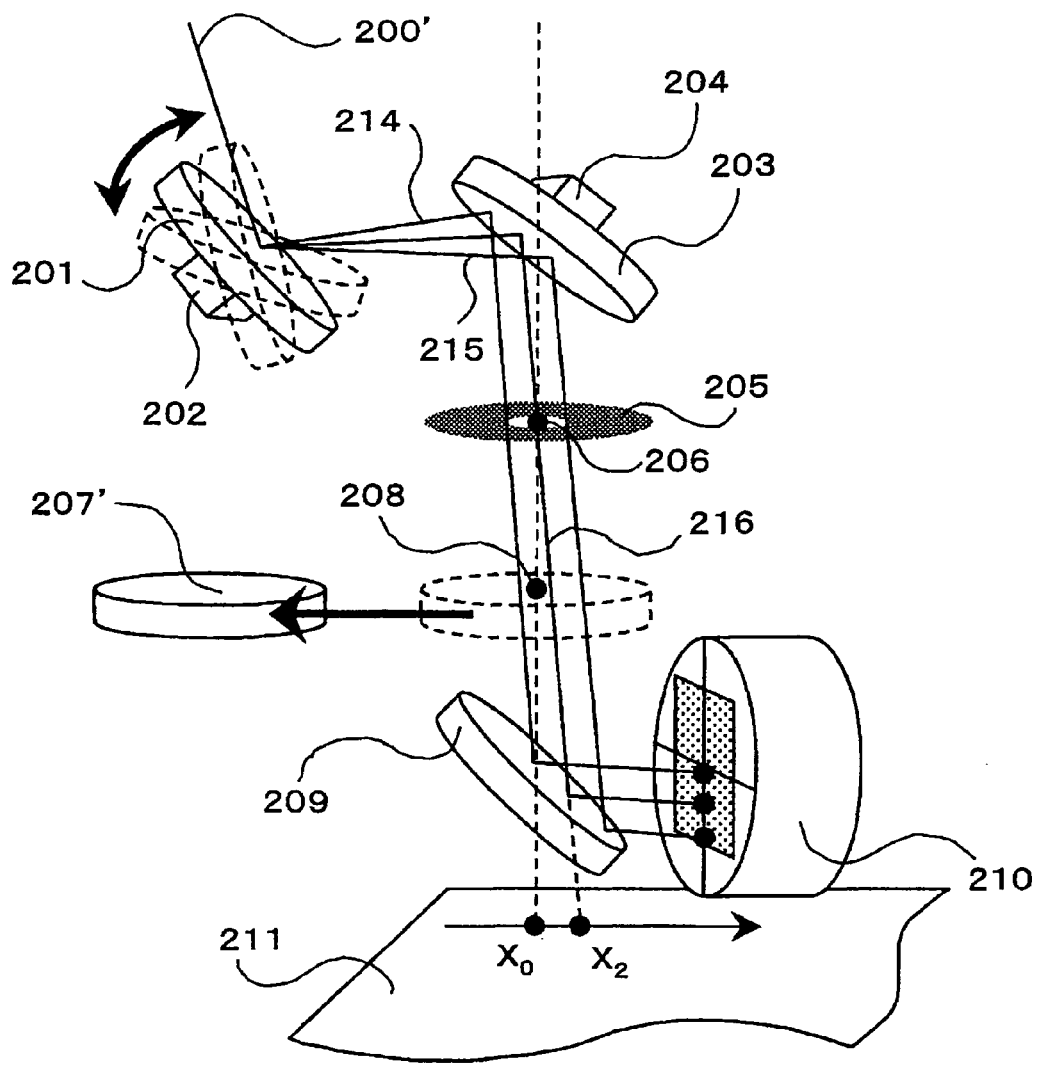
FIG. 11 is a perspective view for explaining an example of the process for correcting the position of the laser beam incident on the laser beam shaping optical element in Embodiment 2 of the apparatus for manufacturing flat panel display devices according to the invention.
Figure 12:
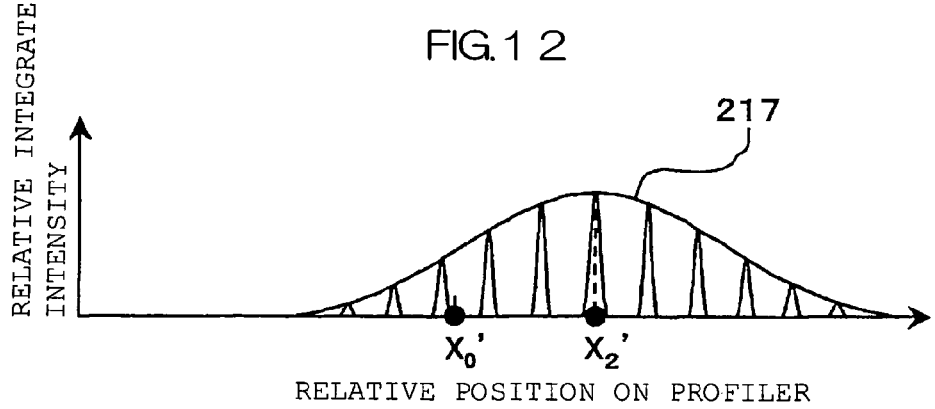
FIG. 12 is a graph showing the integrated intensity of the laser beam plotted as a function with respect to each position detected by a profiler in Embodiment 2 of the apparatus for manufacturing flat panel display devices according to the invention.
Figure 13:
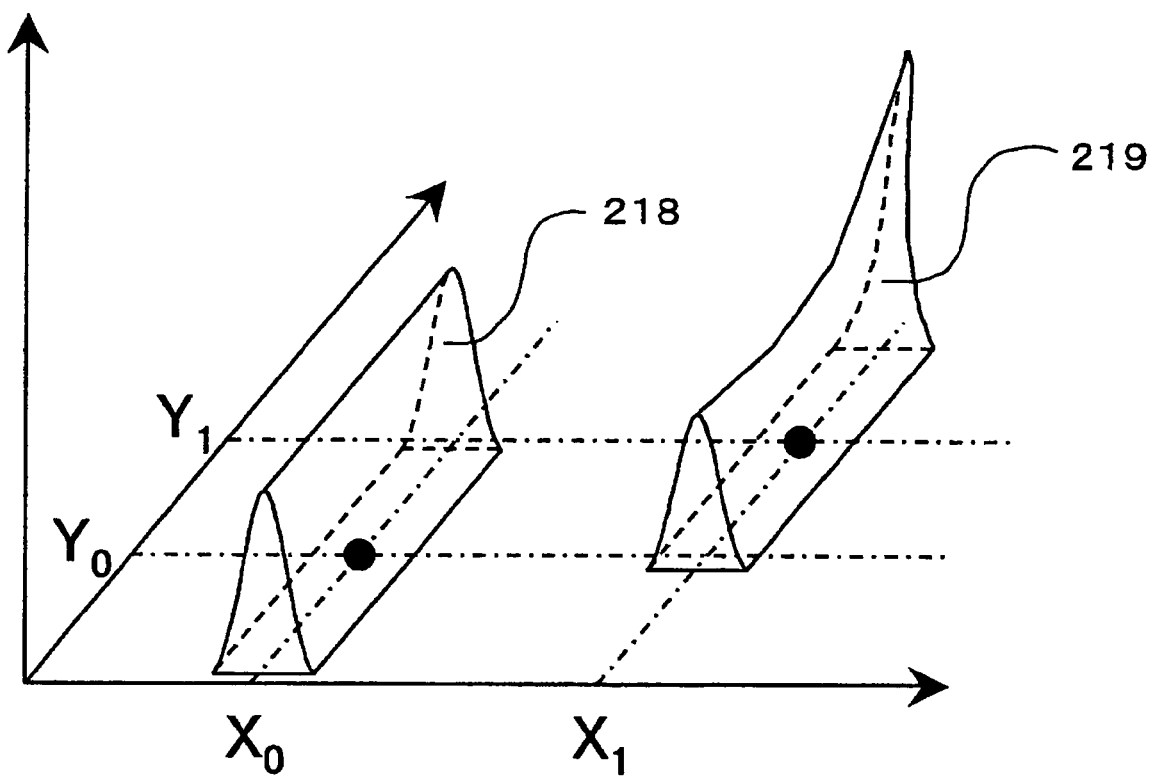
FIG. 13 is a perspective view showing an example of the state in which the intensity distribution of the shaped laser beam becomes non-uniform when the position of the laser beam incident on the laser beam shaping optical element is displaced in Embodiment 2 of the apparatus for manufacturing flat panel display devices according to the invention.
Figure 14:
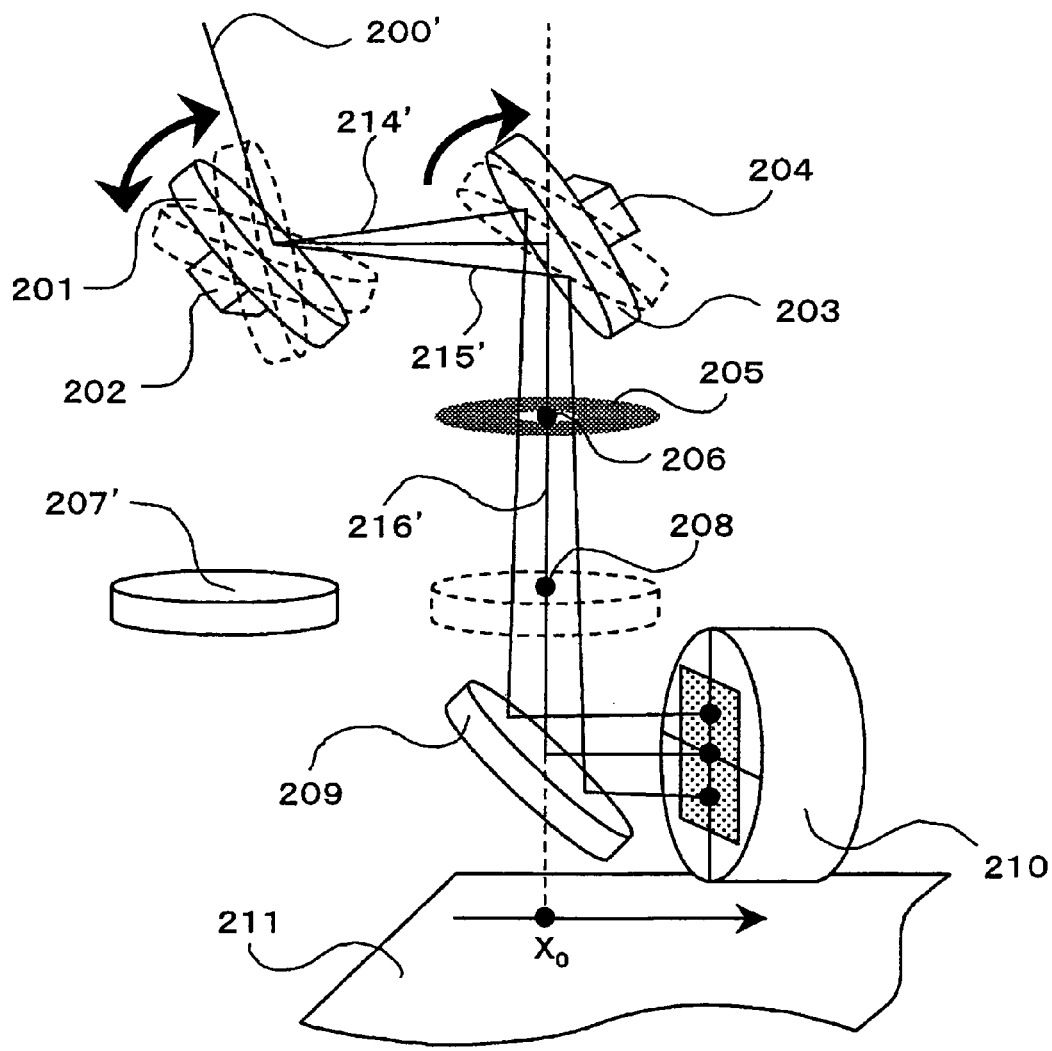
FIG. 14 is a perspective view for explaining an example of a process for correcting the position of the laser beam incident on the laser beam shaping optical element in Embodiment 2 of the apparatus for manufacturing flat panel display devices according to the invention.
Figure 15:
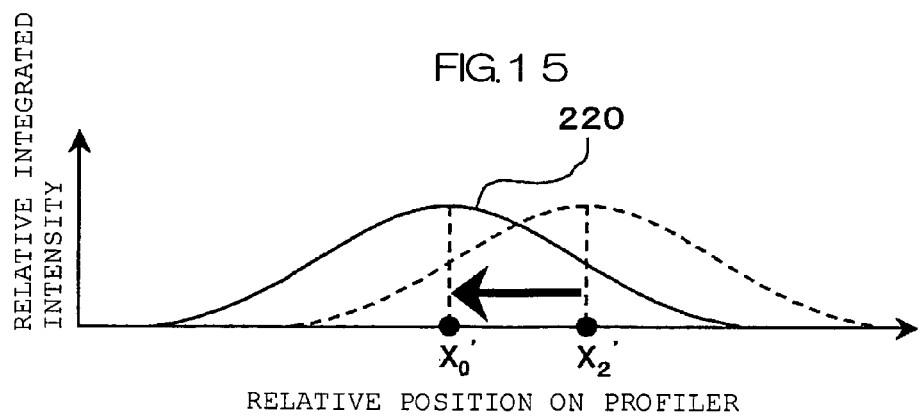
FIG. 15 is a graph showing the integrated intensity of the laser beam plotted as a function with respect to each position detected by a profiler in Embodiment 2 of the apparatus for manufacturing flat panel display devices according to the invention.

Next, the process for correcting the misaligned optical axis to its original state will be described specifically. FIG. 11 is a perspective view for explaining an example of the process for correcting the position of the laser beam incident on the laser beam shaping optical element in Embodiment 2 of the flat panel display device manufacturing apparatus according to the invention. FIG. 11 shows a process for aligning the optical axis of the laser beam in the case where the optical axis of the laser beam is displaced from the ideal optical axis. FIG. 12 is a graph showing the integrated intensity of the laser beam plotted as a function with respect to each position detected by the profiler in Embodiment 2 of the flat panel display device manufacturing apparatus according to the invention. FIG. 13 is a perspective view showing an example of the state in which the intensity distribution of the shaped laser beam becomes non-uniform in accordance with displacement in the position of the laser beam incident on the laser beam shaping optical element in Embodiment 2 of the flat panel display device manufacturing apparatus according to the invention. FIG. 14 is a perspective view for explaining an example of the process for correcting the position of the laser beam incident on the laser beam shaping optical element in Embodiment 2 of the flat panel display device manufacturing apparatus according to the invention. FIG. 15 is a graph showing the integrated intensity of the laser beam plotted as a function with respect to each position detected by the profiler in Embodiment 2 of the flat panel display device manufacturing apparatus according to the invention.

The optical axis 200 shown in FIG. 10 changes to an optical axis 200' shown in FIG. 11. Consequently, as shown in FIG. 13, the laser irradiation position on the substrate stage is displaced from the reference coordinates ($X_0, Y_0$) to coordinates ($X_1, Y_1$). A spatial intensity distribution 218 suitable for annealing is formed at the point of the reference coordinates ($X_0, Y_0$). On the other hand, when the irradiation position is displaced to ($X_1, Y_1$), a spatial intensity distribution 219 non-uniform in intensity and unsuitable for annealing is formed as well as the coordinates of the irradiation position are displaced. Returning the subject of discussion to the description of the optical axis alignment process, the optical axis is aligned with respect to the X axis and the Y axis independently.

In this embodiment, the description of an X-axis alignment process will be made in detail but the description of an Y-axis alignment process will be omitted. The following alignment method can be basically applied to an arbitrary axis. First, the laser beam shaping optical element 207 is moved out of the optical axis. Then, the hole of the iris 205 is set so as to be sufficiently smaller than the beam diameter. Then, the driver sends a signal to the driving mechanism 202 of the mirror 201 to tilt the mirror and change the optical axis so that the laser beam is moved in the X-axis direction on the stage 211.

Incidentally, the mirror 203 is fixed at this time. In this case, the laser beam 200' moves uniaxially on the iris 205 (i.e. the laser beam 200' crosses the hole of the iris 205). Part of the laser beam 200' extracted by the iris 205 is split by the splitter 209 and detected by the profiler 210. The behavior of the laser beam on the iris correlates with the behavior of the laser beam on the photon acceptance surface of the profiler 210. When the optical axis changes to optical axes 214, 215 and 216 in accordance with the motion of the mirror 201, the laser beam is also moved uniaxially on the profiler 210.

On this occasion, the intensity distribution of the laser beam is of a Gaussian function type. Accordingly, the integrated intensity of the laser beam extracted by the iris 205 becomes highest when the center 206 of the iris 205 coincides with the center of the laser beam, that is, when the optical axis of the laser beam coincides with the optical axis 216. When the laser beam is moved left and right, the integrated intensity of the laser beam decreases like a Gaussian function. This phenomenon is used for calculating displacement of the irradiation position from the reference coordinate. When the integrated intensity of the laser beam extracted by the iris 205 in each scanning cycle is measured by the profiler 210 and plotted as a function with respect to each detection position on the photon acceptance surface of the profiler 210, a curve 217 having a gentle peak as shown in FIG. 12 can be obtained.

The coordinate of the center position $X_2'$ of the curve is extracted by processing such as fitting as occasion demands. The difference between the coordinate $X_2'$ and the reference coordinate $X_0'$ is calculated. When the difference reaches a predetermined value or a higher value, as shown in FIG. 14, feedback control of the driving mechanism 204 for driving the mirror 203 is performed t tilt the mirror 203 in a direction in which the difference decreases. Then, the mirror 202 is tilted again. While the laser beam is moved on the iris 205, the laser beam is detected by the profiler 210. The difference between the coordinate of the center of a curve in which the integrated intensity of the laser beam is plotted as a function with respect to the irradiation position in the same manner as described above and the reference coordinate is calculated.

This process is repeated until the difference converges at a value not larger than a predetermined value. As shown in FIG. 15, optical axis alignment is performed until the maximum of the curve 220 and the reference coordinate $X_0'$ converge at predetermined values. At a point of time when the maximum of the curve 220 and the reference coordinate $X_0'$ converge at the predetermined values, optical axis alignment in the X-axis direction is terminated. Then, optical axis alignment in the Y-axis direction is performed in the same manner as described above until the coordinate of the optical axis returns to the predetermined reference coordinate $Y_0'$. Finally, the hole of the iris 205 is opened so that the diameter of the hole becomes sufficiently large compared with the beam diameter. The laser beam shaping optical element 207 is returned to the predetermined position. In this manner, the optical axis 200' of the laser beam is restored to a state in which the laser beam passes through the center 206 of the iris 205 after the mirror 203 and is made perpendicularly incident on the surface of the laser beam shaping optical element 207 and in which the shaped laser beam after passing through the center 208 is applied on the point of the reference coordinates $(X_0, Y_0)$ on the stage 211.

Incidentally, after the optical axis alignment, the profiler 205 disposed on the stage may be driven to the point of the reference coordinates so that the optical axis can be aligned finely as occasion demands. That is, the spatial intensity distribution of the shaped laser beam is measured. A result of the measurement is processed by the signal processing unit. The processed information is fed back to the mirror 203 to align the optical axis finely. Although this embodiment has been described on the case where the integrated intensity of the laser beam detected by the profiler is used as a signal, the invention may be applied to the case where the peak intensity on the profiler is used as a signal. Any method may be used if the relative intensity or relative energy of the laser beam extracted by the iris can be plotted as a function with respect to position on the photon acceptance surface of the profiler. Although this embodiment has been described on the case where a CCD type beam profiler is used as a detection mechanism for detecting the misalignment of the optical axis, any detection mechanism such as a beam profiler of the type of measuring the beam shape by scanning a knife edge or a rectangular slit on a power meter may be used if the position irradiated with the laser beam can be detected as two-dimensional spatial information.

Figure 16:
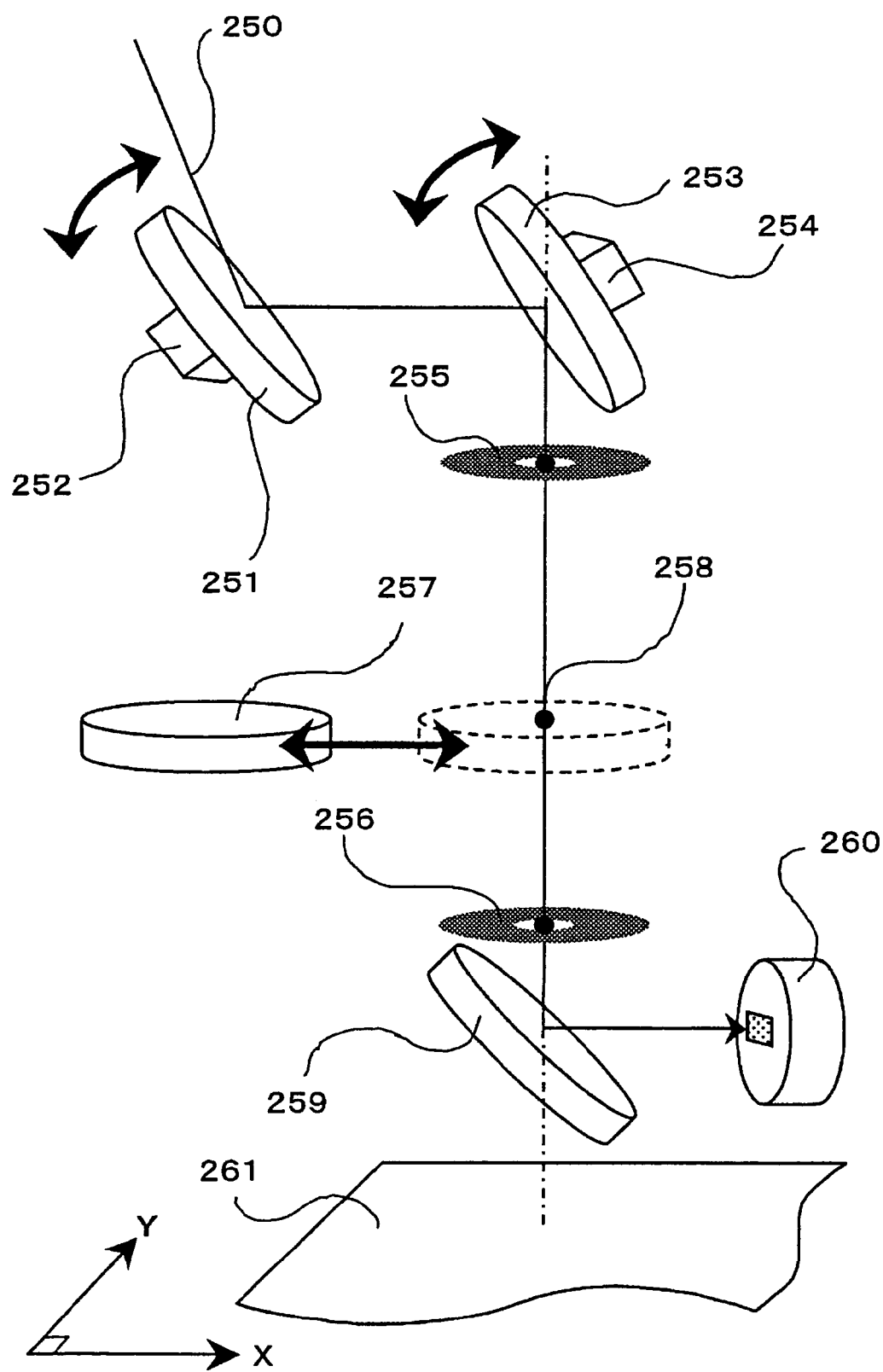
FIG. 16 is a perspective view for explaining an example of the process for correcting the position of the laser beam incident on the laser beam shaping optical element in Embodiment 3 of the apparatus for manufacturing flat panel display devices according to the invention.

Next, a mechanism for detecting the displacement of the position of the laser beam incident on the laser beam shaping optical element by a method different from the aforementioned method and correcting the incidence position to a predetermined incidence position will be described as another embodiment. FIG. 16 is a perspective view for explaining an example of the process for correcting the position of the laser beam incident on the laser beam shaping optical element in Embodiment 3 of the flat panel display device manufacturing apparatus according to the invention.

FIG. 16 shows the schematic configuration of a laser beam irradiation position control mechanism and an irradiation optical system corresponding to this embodiment in the flat panel display device manufacturing apparatus according to the invention.

In this embodiment, the laser beam irradiation position control mechanism includes: at least two optical axis alignment mirrors 251 and 253; driving mechanisms 252 and 254 for driving the mirrors 251 and 253 on the basis of received pulse signals; at least two irises 255 and 256; a beam splitter 259; a laser beam intensity detection mechanism 260 such as a beam profiler or a photo diode; a signal processing unit (not shown) for processing a signal detected by the detection mechanism 260; and a mirror driving mechanism driver (not shown) for sending pulse signals to the mirror driving mechanisms in accordance with the processed signal. The respective constituent members are disposed as shown in FIG. 16 relative to the laser beam shaping optical element 257 and the stage 261.

When the optical axis of the laser beam is moved from the predetermined optical axis to the optical axis 250, the displacement of the optical axis is detected as change in amplitude of the integrated intensity of the laser beam applied on the photon acceptance surface of the beam intensity detection mechanism 260 after passing through the irises 255 and 256. A signal as a result of the detection is processed as occasion demands. Feedback control of the optical axis alignment mirrors 251 and 253 is performed on the basis of the result so that the optical axis is corrected to the predetermined optical axis. First, the laser beam shaping optical element 257 supported by a retaining/driving mechanism (not shown) is driven to go far from the optical axis. Then, the irises 255 and 256 are set to be sufficiently small compared with the beam diameter. The laser beam intensity signal having passed through the irises 255 and 256 is detected by the beam intensity detection mechanism 260 such as a beam profiler.

Then, the beam intensity signal acquired by the detection signal processing unit (not shown) is subjected to processing such as A/D conversion to calculate the level of the signal. This calculated value is compared with a registered signal level (the arrangement of the optical axis and the irises 255 and 256 are adjusted in advance so that the quantity of light passing through the irises 255 and 256 is maximized). When the calculated value is lower than the predetermined value, the optical axis alignment is performed. The optical axis alignment will be described in conjunction with the following procedure. The optical axis alignment is performed independently with respect to at least two axes, that is, an arbitrary axis (hereinafter referred to as X axis) and an axis (hereinafter referred to as Y axis) perpendicular to the X axis so that the optical axis is restored to the predetermined optical axis. As shown in FIG. 16, the respective tilts of the two mirrors 251 and 253 are adjusted.

A driver (not shown) sends a signal to the driving mechanism 252 of the mirror 251 to change the optical axis of the laser beam. Incidentally, on this occasion, it is assumed that the mirror 253 is fixed. In this case, the laser beam 250 moves uniaxially on the iris 255 (i.e. the laser beam 250 crosses the hole of the iris 255). Part of the laser beam 250 extracted from the iris 255 is further extracted by the iris 256. Only the laser beam having passed through the two irises 255 and 256 is partially split by the splitter 259. The split laser beam is detected by the intensity detection mechanism 260. The behavior of the laser beam on each iris correlates with the behavior of the laser beam on the photon acceptance surface of the intensity detection mechanism 260. When the laser beam is moved in the X-axis direction in accordance with the motion of the mirror 251, the laser beam on the intensity detection mechanism 260 is moved uniaxially.

On this occasion, the intensity distribution of the laser beam is of a Gaussian function type. Accordingly, the integrated intensity of the laser beam extracted by the iris 255 has a peak at a certain point during scanning. When the laser beam is moved left and right from this point, the integrated intensity of the laser beam decreases like a Gaussian function. This phenomenon is used for adjusting the tilt of the mirror so that the integrated intensity of the laser beam coincides with the peak. Then, while the mirror 253 is tilted and the laser beam is moved in the X-axis direction, feedback control of the tilt of the mirror 253 is performed so that the integrated intensity of the laser beam is maximized.

This process is repeated until the integrated intensity in the X-axis direction is maximized. At a point of time when the integrated intensity in the X-axis direction is maximized, the optical axis alignment in the X-axis direction is terminated. Then, optical axis alignment in the Y-axis direction is performed as follows. Feedback control of the respective tilts of the mirrors 251 and 253 is performed so that the integrated intensity in the Y-axis direction is maximized. At a point of time when the integrated intensity in the Y-axis direction is maximized, the optical axis alignment in the Y-axis direction is terminated. Finally, the irises 255 and 256 are opened so that the diameter of the hole in each of the irises 255 and 256 is sufficiently large compared with the beam diameter. The laser beam shaping optical element 257 is restored to the predetermined position. Thus, the optical axis alignment in this embodiment is terminated. Incidentally, after the optical axis alignment, the profiler 260 disposed on the stage may be driven to the point of the reference coordinates so that the optical axis can be aligned finely as occasion demands. That is, the spatial intensity distribution of the shaped laser beam is measured. A result of the measurement is processed by the signal processing unit. The processed information is fed back to the mirror 253 to align the optical axis finely.

As described above, in the flat panel display device manufacturing apparatus according to the invention, there is provided a mechanism in which the intensity distribution of the laser beam, the beam diameter of the laser beam and the displacement of the laser beam from the optical axis are always measured and in which feedback control is performed to restore the state into a predetermined state automatically when the variation in each value with the passage of time is detected. Accordingly, the production yield is improved so that the production cost can be reduced.

While we have shown and described several embodiments in accordance with our invention, it should be understood that disclosed embodiments are susceptible of changes and modifications with out departing from the scope of the invention. Therefore, we do not intend to be bound by the details shown and described herein but intend to cover all such changes and modifications a fall within the ambit of the appended claims.

We claim:

1. An apparatus for manufacturing flat panel display devices including thin film transistors formed in such a manner that a silicon film formed on an insulating substrate is irradiated with a laser beam to improve the quality of said silicon film, which comprises: laser beam intensity distribution shaping element by which the intensity distribution of said laser beam applied on said silicon film is adjusted to a desired intensity distribution; intensity distribution holding system by which the intensity distribution of the laser beam incident on said laser beam intensity distribution shaping element is kept in a predetermined intensity distribution; laser beam spatial intensity distribution detector for detecting the spatial intensity distribution of the laser beam incident on said laser beam intensity distribution shaping element; processing unit for processing an acquired spatial intensity distribution signal to extract information concerning the shape and beam diameter of the laser beam; beam diameter controller for controlling the beam diameter to a predetermined numerical value on the basis of said information acquired by said processing unit; optical axis displacement detector for detecting displacement of an optical axis of the laser beam incident on said laser beam intensity distribution shaping element; and optical axis controller by which the optical axis of the laser beam incident on said laser beam intensity distribution shaping element is controlled to a predetermined optical axis.

2. An apparatus for manufacturing flat panel display devices according to claim 1, wherein said laser beam intensity distribution holding system includes two convex lenses, and a spatial filter disposed at a focal point of the laser beam focused by said convex lenses, said spatial filter being provided to remove spatial noise when the focused laser beam passes through said spatial filter.

3. An apparatus for manufacturing flat panel display devices according to claim 1, wherein said beam diameter controller includes two convex lenses used in said laser beam intensity distribution shaping element, and driver for driving said convex lenses in a direction of the optical axis.

4. An apparatus for manufacturing flat panel display devices according to claim 1, wherein said optical axis controller includes: at least two mirrors having driving mechanisms respectively; and at least one iris having a hole with a variable diameter.

5. An apparatus for manufacturing flat panel display devices according to claim 1, wherein said laser beam is selected from the group consisting of a continuous-wave solid-state laser beam, a temporally modulated continuous-wave solid-state laser beam, and a pulsed solid-state laser beam.

* * * * *